(12) United States Patent
Muramatsu et al.

(10) Patent No.: US 11,997,874 B2
(45) Date of Patent: May 28, 2024

(54) PHASE DIFFERENCE FILM, CIRCULARLY POLARIZING PLATE, AND ORGANIC ELECTROLUMINESCENT DISPLAY DEVICE

(71) Applicant: FUJIFILM Corporation, Tokyo (JP)

(72) Inventors: Ayako Muramatsu, Kanagawa (JP); Mayumi Nojiri, Kanagawa (JP); Ryoji Goto, Kanagawa (JP); Hideyuki Nishikawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 651 days.

(21) Appl. No.: 17/313,330

(22) Filed: May 6, 2021

(65) Prior Publication Data

US 2021/0265595 A1   Aug. 26, 2021

Related U.S. Application Data

(63) Continuation of application No. PCT/JP2019/044142, filed on Nov. 11, 2019.

(30) Foreign Application Priority Data

Nov. 13, 2018   (JP) .................. 2018-212871

(51) Int. Cl.
   *H10K 50/86*   (2023.01)
   *G02B 5/30*   (2006.01)
(52) U.S. Cl.
   CPC ........... *H10K 50/86* (2023.02); *G02B 5/3016* (2013.01)
(58) Field of Classification Search
   CPC ...................................... H10K 50/86
   USPC .......................................... 257/40
   See application file for complete search history.

(56) References Cited

U.S. PATENT DOCUMENTS

| 6,853,437 B1* | 2/2005 | Kaneko ............. G02F 1/133636 |
| | | 349/194 |
| 2010/0188324 A1* | 7/2010 | Ohashi ................. G09G 3/3426 |
| | | 345/102 |
| 2012/0133871 A1 | 5/2012 | Saigusa et al. |

(Continued)

FOREIGN PATENT DOCUMENTS

| JP | 2004-070344 A | 3/2004 |
| JP | 2010-031223 A | 2/2010 |
| JP | 2011-256304 A | 12/2011 |

(Continued)

OTHER PUBLICATIONS

Office Action, issued by the Japanese Patent Office dated Jun. 14, 2022, in connection with Japanese Patent Application No. 2020-555680.

(Continued)

*Primary Examiner* — Ajay Arora
(74) *Attorney, Agent, or Firm* — Edwards Neils LLC; Jean C. Edwards, Esq.

(57) ABSTRACT

The present invention provides a phase difference film in which reflection of external light is suppressed, tinting of reflected light is suppressed, and tinting at the time of white display is suppressed in a case where the phase difference film is applied to a display device; a circularly polarizing plate; and an organic electroluminescent display device. The phase difference film of an embodiment of the present invention has an in-plane retardation of 100 to 200 nm at a wavelength of 550 nm and satisfies Requirement 1: Δxy<0.010 and Requirement 6: 0.10<Slope S≤1.0.

20 Claims, 9 Drawing Sheets

(56) References Cited

U.S. PATENT DOCUMENTS

2014/0204460 A1    7/2014  Nam et al.
2015/0042944 A1*   2/2015  Hatanaka ............. G02B 5/3083
                                                        349/194

FOREIGN PATENT DOCUMENTS

JP    2015-163938 A    9/2015
WO    2010/150693 A1   12/2010

OTHER PUBLICATIONS

International Search Report issued in PCT/JP2019/044142 dated Dec. 24, 2019.
Written Opinion issued in PCT/JP2019/044142 dated Dec. 24, 2019.
International Preliminary Report on Patentability completed by WIPO dated Jan. 20, 2021 in connection with International Patent Application No. PCT/JP2019/044142.
Office Action, issued by the Japanese Patent Office dated Dec. 14, 2021, in connection with Japanese Patent Application No. 2020-555680.

* cited by examiner

WAVELENGTH

FILM A-1

FILM A-2

FILM A-3

FILM A-4

FILM A-5

FILM A-6

FILM A-7

FILM A-8

FILM A-9

FILM A-10

PHASE DIFFERENCE FILM, CIRCULARLY POLARIZING PLATE, AND ORGANIC ELECTROLUMINESCENT DISPLAY DEVICE

CROSS-REFERENCE TO RELATED APPLICATIONS

This application is a Continuation of PCT International Application No. PCT/JP2019/044142 filed on Nov. 11, 2019, which was published under PCT Article 21(2) in Japanese, and which claims priority under 35 U.S.C. § 119(a) to Japanese Patent Application No. 2018-212871 filed on Nov. 13, 2018. The above applications are hereby expressly incorporated by reference, in their entirety, into the present application.

BACKGROUND OF THE INVENTION

1. Field of the Invention

The present invention relates to a phase difference film, a circularly polarizing plate, and an organic electroluminescent display device.

2. Description of the Related Art

A circularly polarizing plate has been used in an organic electroluminescent (EL) display device in order to suppress an adverse effect due to reflection of external light in the related art. Examples of a phase difference film included in the circularly polarizing plate include a phase difference film (optical film) as described in JP2010-031223A.

SUMMARY OF THE INVENTION

On the other hand, in recent years, in a display device typified by an organic EL display device, it has been required that reflection of external light should be further reduced in a case where the display device includes a circularly polarizing plate.

In addition, in the display device including the circularly polarizing plate, it has been required that tinting of reflected light should be further suppressed.

Furthermore, in the display device including the circularly polarizing plate, it has been required to further suppress tinting at the time of white display.

In view of the circumstances, an object of the present invention is to provide a phase difference film in which reflection of external light is suppressed, tinting of reflected light is suppressed, and tinting at the time of white display is suppressed in a case where the phase difference film is applied to a display device.

In addition, another object of the present invention is to provide a circularly polarizing plate and an organic electroluminescent display device.

The present inventors have conducted intensive studies on the problems in the related art, and as a result, they have found that the objects can be accomplished by using a phase difference film satisfying predetermined requirements.

That is, the objects can be accomplished by the following configurations.

(1) A phase difference film formed of at least a liquid crystal compound,
in which an in-plane retardation at a wavelength of 550 nm is 100 to 200 nm,
on a CIE xy chromaticity diagram, $\Delta xy$ which is a difference between a chromaticity of transmitted light obtained by making light of a standard light source D65 incident on the phase difference film and a chromaticity of the standard light source D65 satisfies Requirement 1 which will be described later, and
in a graph where wavelengths of measurement light incident on the phase difference film are plotted on a horizontal axis and in-plane retardations of the phase difference film at every 25 nm wavelength of measurement light in a wavelength range of 450 to 600 nm are plotted on a vertical axis, all of slopes S of straight lines connecting two adjacent plot points satisfy Requirement 6 which will be described later.

(2) The phase difference film as described in (1),
in which in a graph where wavelengths of measurement light incident on the phase difference film are plotted on a horizontal axis and in-plane retardations of the phase difference film at every 25 nm wavelength of measurement light in a wavelength range of 450 to 650 nm are plotted on a vertical axis, all of slopes S of straight lines connecting two adjacent plot points satisfy Requirement 7 which will be described later.

(3) The phase difference film as described in (1) or (2),
in which in the graph, a slope S(550) of a straight line obtained by connecting the plot point at a wavelength of 550 min of the measurement light and the plot point at a wavelength of 575 nm of the measurement light satisfies Requirement 8 which will be described later.

(4) The phase difference film as described in any one of (1) to (3),
in which in the graph, a slope S(625) of a straight line obtained by connecting a plot point at a wavelength of 625 nm of the measurement light and a plot point at a wavelength of 650 n of the measurement light satisfies Requirement 9 which will be described later.

(5) A phase difference film formed of at least a liquid crystal compound,
in which an in-plane retardation at a wavelength of 550 nm is 100 to 200 nm,
on a CIE xy chromaticity diagram, $\Delta xy$ which is a difference between a chromaticity of transmitted light obtained by making light of a standard light source D65 incident on the phase difference film and a chromaticity of the standard light source D65 satisfies Requirement 1 which will be described later, and
in a graph where wavelengths of measurement light incident on the phase difference film are plotted on a horizontal axis and in-plane retardations of the phase difference film at the respective wavelengths of measurement light standardized by setting an in-plane retardation of the phase difference film at a measurement wavelength of 550 nm to 1.0 are plotted on a vertical axis, an in-plane retardation Re(1) of the phase difference film at a wavelength of kl in a wavelength range of 450 to 550 nm satisfies Requirement 10 which will be described later and an in-plane retardation $Re(\lambda 2)$ of the phase difference film at a wavelength of $\lambda 2$ in a wavelength range of 550 to 650 nm satisfies Requirement 11 which will be described later.

(6) The phase difference film as described in any one of (1) to (5),
in which the liquid crystal compound exhibits reciprocal wavelength dispersibility.

(7) A circularly polarizing plate comprising:
a polarizer; and
the phase difference film as described in any one of (1) to (6).

(8) An organic electroluminescent display device comprising:
an organic electroluminescent display panel; and
the circularly polarizing plate as described in (7) arranged on the organic electroluminescent display panel.

According to the present invention, it is possible to provide a phase difference film in which reflection of external light is suppressed, tinting of reflected light is suppressed, and tinting at the time of white display is suppressed in a case where the phase difference film is applied to a display device.

In addition, according to the present invention, it is possible to provide a circularly polarizing plate and an organic electroluminescent display device.

DESCRIPTION OF THE PREFERRED EMBODIMENTS

Figure 1:
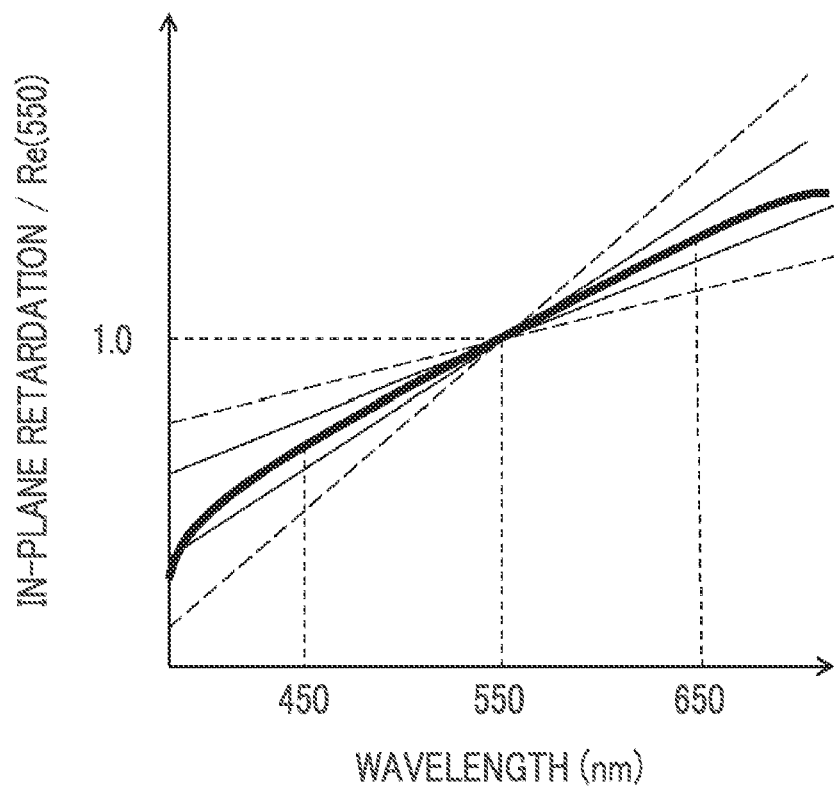
FIG. 1 is a view for explaining Requirements 2 to 5, 10, and 11.

Hereinafter, the present invention will be described in detail. Furthermore, in the present specification, a numerical range expressed using "to" is used in a meaning of a range that includes the preceding and succeeding numerical values of "to" as the lower limit value and the upper limit value, respectively. First, terms used in the present specification will be described.

In the present invention, $Re(\lambda)$ and $Rth(\lambda)$ represent an in-plane retardation and a thickness-direction retardation at a wavelength of $\lambda$, respectively. For example, $Re(450)$ represents an in-plane retardation at a wavelength of 450 run. The wavelength X refers to 550 nm unless otherwise specified.

In the present invention, $Re(\lambda)$ and $Rth(\lambda)$ are values measured at a wavelength of $\lambda$ in AxoScan OPMF-1 (manufactured by Opto Science, Inc.). By inputting an average refractive index $((nx+ny+nz)/3)$ and a film thickness (d (μm)) to AxoScan, the value can be calculated:
Slow axis direction (°)
$Re(\lambda)=R0(\lambda))$.
$Rth(\lambda)=((nx+ny)/2-nz)\times d$.

Furthermore, $R0(\lambda)$ is expressed in a numerical value calculated with AxoScan OPMF-1, but means $Re(\lambda)$.

In the present specification, the refractive indices, nx, ny, and nz are measured using an Abbe refractometer (NAR-4T, manufactured by Atago Co., Ltd.) and using a sodium lamp ($\lambda$=589 nm) as a light source. In addition, in a case where wavelength dependence is measured, the wavelength dependency can be measured with a multi-wavelength Abbe refractometer DR-M2 (manufactured by Atago Co., Ltd.) in combination with an interference filter.

Moreover, the values mentioned in Polymer Handbook (JOHN WILEY & SONS, INC.) and the catalogues of various optical films can be used. The values of the average refractive indices of major optical films are exemplified below: cellulose acylate (1.48), cycloolefin polymer (1.52), polycarbonate (1.59), polymethyl methacrylate (1.49), and polystyrene (1.59).

In addition, in the present specification, the Nz factor is a value given by $Nz=(nx-nz)/(nx-ny)$.

Furthermore, in the present specification, "visible light" means light at 400 to 700 nn.

In addition, in the present specification, angles (for example, an angle of "90°") and relations thereof (for example, "orthogonal", "parallel", and "intersecting at 45°") include a range of errors accepted in the technical field to which the present invention belongs. For example, the angle means an angle in a range within a rigorous angle±10°, and the error from the rigorous angle is preferably in a range of ±5°, and more preferably in a range of ±3°.

In the present specification, the "absorption axis" of a polarizer means a direction in which the absorbance is highest. A "transmission axis" means a direction in which an angle of 90° is formed with respect to the "absorption axis".

The bonding direction of a divalent group (for example, —O—CO—) as noted in the present specification is not particularly limited, and for example, in a case where $D^1$ in Formula (I) which will be described later is —O—CO—, and *1 and *2 represent a bonding position to the Ar side and a bonding position to the $G^1$ side, respectively, $D^1$ may be either *1-O—CO—*2 or * 1-CO—O—*2.

Hereinafter, the phase difference film, the circularly polarizing plate, and the organic electroluminescent display device (organic EL display device) of embodiments of the present invention will be described with reference to drawings.

Furthermore, the phase difference film, the circularly polarizing plate, and the organic EL display device will be described below in this order. In addition, the phase difference film will be described by dividing it into a first embodiment and a second embodiment.

<Phase Difference Film>

First Embodiment

A first embodiment of the phase difference film (hereinafter also referred to as a "first phase difference film") is a phase difference film formed of a liquid crystal compound, which has an in-plane retardation of 100 to 200 nm at a wavelength of 550 nm and satisfies Requirements 1 to 3 which will be described later.

In addition, as described later, it is preferable that the first embodiment of the phase difference film satisfies Requirements 1, 10, and 11 which will be described later.

Hereinafter, the configuration of the first phase difference film will be described in detail.

The in-plane retardation Re(550) of the first phase difference film at a wavelength of 550 nm is 100 to 200 nm, and from at least one of a viewpoint that reflection of external light is further suppressed, a viewpoint that tinting of reflected light is further suppressed, or a viewpoint that tinting at the time of white display is further suppressed (hereinafter also referred to as "the viewpoint where the effect of the present invention is more excellent"), the in-plane retardation Re(550) is preferably 120 to 160 nm, more preferably 130 to 150 nm, and particularly preferably 130 to 140 nm.

The retardation Rth (550) in the thickness direction at a wavelength of 550 nm of the first phase difference film is not particularly limited, but is preferably 50 to 100 un, more preferably 60 to 80 nm, and still more preferably 65 to 75 nm.

The first phase difference film preferably exhibits reciprocal wavelength dispersibility. Further, the reciprocal wavelength dispersibility is preferably exhibited in the visible light region.

The expression that the first phase difference film exhibits reciprocal wavelength dispersibility means that the in-plane retardation of the first phase difference film increases as a measurement wavelength increases. In other words, Re(450), Re(550), and Re(650) which will be described later satisfy the following Relation X.

Relation X: Re(450)<Re(550)<Re(650)

Re(450)/Re(550) of the first phase difference film is preferably 0.75 to 0.99, and more preferably 0.80 to 0.95. Re(450)/Re(550) represents a ratio of Re(450) which is an in-plane retardation of the first phase difference film at a wavelength of 450 nm to Re(550) which is an in-plane retardation of the first phase difference film at a wavelength of 550 nm.

Re(650)/Re(550) of the first phase difference film is preferably 1.03 to 1.20, and more preferably 1.08 to 1.15. Re(650)/Re(550) represents a ratio of Re(650) which is an in-plane retardation of the first phase difference film at a wavelength of 650 nm to Re(550) which is an in-plane retardation of the first phase difference film at a wavelength of 550 nm.

on a CIE xy chromaticity diagram, $\Delta xy$ which is a difference between a chromaticity of transmitted light obtained by making light of a standard light source D65 incident on the first phase difference film and a chromaticity of the standard light source D65 (the chromaticity of light of the standard light source D65) satisfies Requirement 1.

Requirement 1: $\Delta xy < 0.010$

It should be noted that $\Delta xy$ is calculated by the following Formula.

$$\Delta xy = ((x-x0)_2 + (y-y0)_2)^{1/2} \quad \text{Formula:}$$

x and y represent a chromaticity coordinate of transmitted light of the first phase difference film on the CIE xy chromaticity diagram, and x0 and y0 represent a chromaticity coordinate of a standard light source D65 (light of the standard light source D65) on the CIE xy chromaticity diagram.

Among those, $\Delta xy$ is preferably 0.008 or less from the viewpoints that tinting of reflected light is further suppressed and tinting at the time of white display is further suppressed. The lower limit of $\Delta xy$ is not particularly limited, but $\Delta xy$ is 0.001 or more in many cases.

A method for measuring the chromaticity is as follows.

The transmittance of a film is measured at every 10 nm in a wavelength range of 380 to 780 nm using a spectrophotometer (UV-3150, manufactured by Shimadzu Corporation), and the obtained value was multiplied by a spectral distribution of the standard light source D65 to calculate a transmitted light intensity distribution at each wavelength. The obtained transmitted light intensity is multiplied by CIE spectrum tristimulus values (see, for example, "Science of Color, and Color Psychology, Physics, and Physics, compiled by Takayoshi Kaneko"), and added up at all wavelengths, valued thus obtained are each defined as X, Y, and Z, and a value (x, y) standardized to satisfy x+y+z=1 is defined as the chromaticity of transmitted light. Further, as for the standardization method, x=X/(X+Y+Z), y=Y/(X+Y+Z), and z=Z/(X+Y+Z) are determined. Then, $\Delta xy$ which is a difference between the obtained chromaticity (x, y) of transmitted light and the chromaticity (x0, y0)=(0.31271, 0.32902) of the standard light source D65 is calculated according to the above-mentioned Formula.

Furthermore, the chromaticity of transmitted light may be calculated by a simulation assuming that light having a spectral distribution similar to that of the standard light source D65 has been irradiated.

In a graph where wavelengths of measurement light incident on the first phase difference film are plotted on the horizontal axis and in-plane retardations of the first phase difference film at the respective wavelengths of measurement light with an in-plane retardation of the first phase difference film at a measurement wavelength of 550 nm being standardized as 1.0 are plotted on the vertical axis, an in-plane retardation Re($\lambda$1) of the phase difference film at a wavelength of $\lambda$1 in a wavelength range of 450 to 550 nm satisfies Requirement 2 and an in-plane retardation Re($\lambda$2) of the first phase difference film at a wavelength of $\lambda$2 in a wavelength range of 550 to 650 nm satisfies Requirement 3.

Requirement 2: $0.0027 \times \lambda 1 - 0.5 \leq \text{Re}(\lambda 1)/\text{Re}(550) \leq 50.0009 \times \lambda 1 + 0.5$ Requirement 3: $0.0009 \times \lambda 2 + 0.5 \leq \text{Re}(\lambda 2)/\text{Re}(550) \leq 0.0027 \times \lambda 2 - 0.5$ Requirements 2 and 3 will be described in detail with reference to drawings.

First, in a graph (Cartesian coordinates) shown in FIG. 1, the horizontal axis shows the wavelength of measurement light incident on the first phase difference film. The vertical axis shows the in-plane retardation at each wavelength of measurement light standardized by setting the in-plane retardation of the first phase difference film at a measurement wavelength of 550 nm to 1.0. That is, in a case where the in-plane retardation of the first phase difference film at each wavelength is Re($\lambda$) and the in-plane retardation of the first phase difference film at a measurement wavelength of 550 nm is Re(550), the vertical axis shows Re($\lambda$)/Re(550).

Next, the in-plane retardation of the first phase difference film at each wavelength of measurement light is plotted in this graph. Further, in FIG. 1, the curve line shown by a thick line corresponds to a line formed by plotting the in-plane retardations of the first phase difference film (a line formed by connecting the plot points).

The two straight lines shown by the broken lines in FIG. 1 are represented by the following formulae.

Formula A: $Re(\lambda)/Re(550)=0.0027\times\lambda-0.5$
Formula B: $Re(\lambda)/Re(550)=0.0009\times\lambda+0.5$ Requirement 2 indicates that the in-plane retardation $Re(\lambda1)$ of the first phase difference film at a wavelength of $\lambda1$ in a wavelength range of 450 to 550 nm is located between the straight line represented by Formula A and the straight line represented by Formula B. That is, in FIG. 1, the curve line shown by the thick line at a wavelength of 450 to 550 nm is located between the straight line represented by Formula A and the straight line represented by Formula B.

Requirement 3 indicates that the in-plane retardation $Re(2)$ of the first phase difference film at a wavelength of 12 in a wavelength range of 550 to 650 nm is located between the straight line represented by Formula A and the straight line represented by Formula B. That is, in FIG. 1, the curve line shown by the thick line at a wavelength of 550 to 650 nm is located between the straight line represented by Formula A and the straight line represented by Formula B.

The effect of the present invention can be obtained by setting the in-plane retardation of the first phase difference film at each wavelength (450 to 650 nm) to satisfy Requirements 2 and 3.

Among those, from the viewpoint that the effect of the present invention is more excellent, it is preferable that in the above-mentioned graph, the in-plane retardation $Re(\lambda1)$ of the first phase difference film at a wavelength of $\lambda1$ in a wavelength range of 450 to 550 nm satisfies Requirement 4 and the in-plane retardation $Re(\lambda2)$ of the first phase difference film at a wavelength of $\lambda2$ in a wavelength range of 550 to 650 nm satisfies Requirement 5.

Requirement 4: $0.0023\times\lambda1-0.25\leq Re(\lambda1)/Re(550)\leq 0.0014\times\lambda1+0.25$ Requirement 5: $0.0014\times12+0.25\leq Re(\lambda2)/Re(550)\leq 0.0023\times\lambda2-0.25$ The two straight lines represented by the solid lines in FIG. 1 are represented by Formulae.

$Re(\lambda)/Re(550)=0.0023\times\lambda-0.25$ Formula C:

$Re(\lambda)/Re(550)=0.0014\times\lambda+0.25$ Formula D:

Requirement 4 indicates that the in-plane retardation $Re(11)$ of the first phase difference film at a wavelength of kl in a wavelength range of 450 to 550 nm is located between the straight line represented by Formula C and the straight line represented by Formula D. That is, in FIG. 1, the curve line shown by the thick line at a wavelength of 450 to 550 nm is located between the straight line represented by Formula C and the straight line represented by Formula D.

Requirement 5 indicates that the in-plane retardation $Re(\lambda2)$ of the first phase difference film at a wavelength of $\lambda2$ in a wavelength range of 550 to 650 nm is located between the straight line represented by Formula C and the straight line represented by Formula D. That is, in FIG. 1, the curve line shown by the thick line at a wavelength of 550 to 650 nm is located between the straight lines represented by Formula C and Formula D.

In addition, from the viewpoint that the effect of the present invention is more excellent, it is preferable that in the above-mentioned graph, the in-plane retardation $Re(\lambda1)$ of the first phase difference film at a wavelength of $\lambda1$ in a wavelength range of 450 to 550 nm satisfies Requirement 10 and the in-plane retardation $Re(\lambda2)$ of the first phase difference film at a wavelength of 12 in a wavelength range of 550 to 650 nm satisfies Requirement 11.

Requirement 10: $0.0027\times\lambda1-0.5\leq Re(\lambda1)/Re(550)\leq 0.0014\times\lambda1+0.25$ Requirement 11: $0.0009\times\lambda2+0.5\leq Re(\lambda2)/Re(550)\leq 0.0023\times\lambda2-0.25$ Requirement 10 indicates that the in-plane retardation $Re(\lambda1)$ of the first phase difference film at a wavelength of $\lambda l$ in a wavelength range of 450 to 550 nm is located between the straight line represented by Formula A and the straight line represented by Formula D. That is, in FIG. 1, the curve line shown by the thick line at a wavelength of 450 to 550 nm is located between the straight line represented by Formula A and the straight line represented by Formula D.

Requirement 11 indicates that the in-plane retardation $Re(2)$ of the first phase difference film at a wavelength of 2 in a wavelength range of 550 to 650 nm is located between the straight line represented by Formula B and the straight line represented by Formula C. That is, in FIG. 1, the curve line shown by the thick line at a wavelength of 550 to 650 nm is located between the straight lines represented by Formula E and Formula C.

In addition, from the viewpoint that the effect of the present invention is more excellent, it is preferable that the in-plane retardation $Re(\lambda1)$ of the first phase difference film at a wavelength of $\lambda1$ in a wavelength range of 450 to 550 nm satisfies Requirement 12 and the in-plane retardation $Re(\lambda2)$ of the first phase difference film at a wavelength of $\lambda2$ in a wavelength range of 550 to 650 nm satisfies Requirement 13.

Requirement 12: $0.0027\times\lambda1-0.485\leq Re(\lambda1)/Re(550)\leq 0.0009\times\lambda1+0.505$ Requirement 13: $0.0009\times\lambda2+0.505\leq Re(\lambda2)/Re(550)\leq 0.0027\times\lambda2-0.485$ Furthermore, from the viewpoint that the effect of the present invention is more excellent, it is preferable that the in-plane retardation $Re(\lambda1)$ of the first phase difference film at a wavelength of $\lambda1$ in a wavelength range of 450 to 550 nm satisfies Requirement 14 and the in-plane retardation $Re(\lambda2)$ of the first phase difference film at a wavelength of $\lambda2$ in a wavelength range of 550 to 650 nm satisfies Requirement 15.

Requirement 14: $0.0023\times\lambda1-0.265\leq Re(\lambda1)/Re(550)\leq 0.0014\times\lambda1+0.23$ Requirement 15: $0.0014\times\lambda2+0.23\leq Re(\lambda2)/Re(550)\leq 0.0023\times\lambda2-0.265$ In addition, in the present invention, it is preferable that the in-plane retardation $Re(\lambda1)$ of the first phase difference film at a wavelength of $\lambda11$ in a wavelength range of 450 to 500 nm satisfies Requirement 2 and the in-plane retardation $Re(\lambda2)$ of the first phase difference film at a wavelength of $\lambda2$ in a wavelength range of 600 to 650 nm satisfies Requirement 3.

From the viewpoint that the effect of the present invention is more excellent, it is preferable that the first phase difference film satisfies at least one of Requirements 6 to 9 which will be described later.

The thickness of the first phase difference film is not particularly limited and adjusted so that the in-plane retardation is within a predetermined range, but from the viewpoint of making the film thinner, the thickness is preferably 10 μm or less, more preferably 0.5 to 8.0 μm, and still more preferably 0.5 to 6.0 μm.

Furthermore, in the present specification, the thickness of the first phase difference film means an average thickness of the first phase difference film. The average thickness is obtained by measuring the thickness at any five or more points of the first phase difference film and determining an arithmetic mean of the values.

Second Embodiment

A second embodiment of the phase difference film (hereinafter also referred to as a "second phase difference film") is a phase difference film formed of a liquid crystal compound, which has an in-plane retardation of 100 to 200 nm at a wavelength of 550 nm and satisfies Requirements 1 and 6 which will be described later.

Hereinafter, the configuration of the second phase difference film will be described in detail.

The in-plane retardation Re(550) at a wavelength of 550 nm of the second phase difference film is 100 to 200 nm, and from the viewpoint that the effect of the present invention is more excellent, the in-plane retardation Re(550) is more preferably 120 to 160 nm, still more preferably 130 to 150 nm, and particularly preferably 130 to 140 nm.

The retardation Rth (550) in the thickness direction at a wavelength of 550 nm of the second phase difference film is not particularly limited, but is preferably 50 to 100 nm, more preferably 60 to 80 nm, and still more preferably 65 to 75 nm.

The second phase difference film preferably exhibits reciprocal wavelength dispersibility. Further, the reciprocal wavelength dispersibility is preferably exhibited in the visible light region.

The second phase difference film exhibiting the reciprocal wavelength dispersibility means that the in-plane retardation of the second phase difference film increases as the measurement wavelength increases. In other words, Re(450), Rc(550), and Re(650) which will be described later satisfy the following Relation X.

Relation X: Re(450)<Re(550)<Re(650)

Re(450)/Re(550) of the second phase difference film is preferably 0.75 to 0.99, and more preferably 0.80 to 0.95. Re(450)/Re(550) represents a ratio of Re(450) which is an in-plane retardation of the second phase difference film at a wavelength of 450 nm to Re(550) which is an in-plane retardation of the second phase difference film at a wavelength of 550 mu.

In addition, Re(650)/Re(550) of the second phase difference film is preferably 1.03 to 1.20, and more preferably 1.08 to 1.15. Re(650)/Re(550) represents a ratio of Re(650) which is an in-plane retardation of the second phase difference film at a wavelength of 650 nm to Re(550) which is an in-plane retardation of the first phase difference film at a wavelength of 550 nm.

On a CIE xy chromaticity diagram, Δxy which is a difference between a chromaticity of transmitted light obtained by making light of a standard light source D65 incident on the second phase difference film and a chromaticity of the standard light source D65 (light of the standard light source D65) satisfies Requirement 1.

Requirement 1: Δxy<0.010

It should be noted that Δxy is calculated by the following Formula.

$$\Delta xy = ((x-x0)_2 + (y-y0)_2)^{1/2} \quad \text{Formula:}$$

x and y represent a chromaticity coordinate of transmitted light of the second phase difference film on the CIE xy chromaticity diagram, and x0 and y0 represent a chromaticity coordinate of a standard light source D65 (light of the standard light source D65) on the CIE xy chromaticity diagram.

Among those, Δxy is preferably 0.008 or less from the viewpoint that the reflection tint is further reduced. The lower limit of Δxy is not particularly limited, but Δxy is 0.001 or more in many cases.

A method for measuring the chromaticity is as follows.

The transmittance of a film is measured at every 10 nm in a wavelength range of 380 to 780 nm using a spectrophotometer (UV-3150, manufactured by Shimadzu Corporation), and the obtained value was multiplied by a spectral distribution of the standard light source D65 to calculate a transmitted light intensity distribution at each wavelength. The obtained transmitted light intensity is multiplied by CIE spectrum tristimulus values (see, for example, "Science of Color, and Color Psychology, Physics, and Physics, compiled by Takayoshi Kaneko"), and added up at all wavelengths, valued thus obtained are each defined as X, Y, and Z, and a value (x, y) standardized to satisfy x+y+z=1 is defined as the chromaticity of transmitted light. Further, as for the standardization method, x=X/(X+Y+Z), y=Y/(X+Y+Z), and z=Z/(X+Y+Z) are determined. Then, Δxy which is a difference between the obtained chromaticity (x, y) of transmitted light and the chromaticity (x0, y0)=(0.31271, 0.32902) of the standard light source D65 is calculated according to the above-mentioned Formula.

Furthermore, the chromaticity of transmitted light may be calculated by a simulation assuming that light having a spectral distribution similar to that of the standard light source D65 has been irradiated.

In a graph where wavelengths of measurement light incident on the second phase difference film are plotted on the horizontal axis and in-plane retardations of the second phase difference film at every 25 nm wavelength of measurement light in a wavelength range of 450 to 600 nm are plotted on the vertical axis, all of slopes S of straight lines connecting two adjacent plot points satisfy Requirement 6.

Requirement 6: 0.10<Slope S≤1.0

Requirement 6 will be described in detail with reference to drawings.

Figure 2:
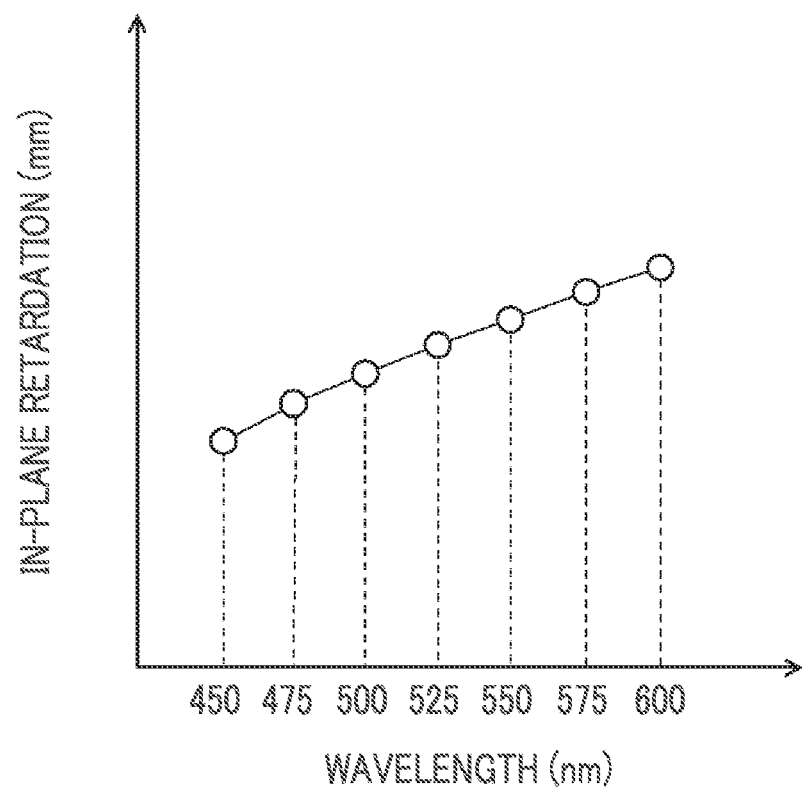
FIG. 2 is a view for explaining Requirement 6.

First, in the graph (Cartesian coordinates) shown in FIG. 2, the horizontal axis shows the wavelength of measurement light incident on the second phase difference film. The vertical axis shows the in-plane retardation (nm) of the second phase difference film at a wavelength of measurement light.

Next, the in-plane retardation of the second phase difference film at each wavelength of measurement light is plotted in this graph. Further, the measurement is carried out with the measurement light at every 25 nm in a wavelength range of 450 to 600 nm. That is, as shown in FIG. 2, the in-plane retardations in measurement light at a wavelength of 450 nm, a wavelength of 475 nm, a wavelength of 500 nm, a wavelength of 525 nm, a wavelength of 550 nm, a wavelength of 575 nm, and a wavelength of 600 nrm are each determined and plotted on a graph.

Next, two adjacent plot points are connected by a straight line. More specifically, as shown in FIG. 2, the plot point at a wavelength of 450 nm and the plot point at a wavelength of 475 nm are connected by a straight line (straight line 1), the plot point at a wavelength of 475 nm and the plot point at a wavelength of 500 nm are connected by a straight line (straight line 2), the plot point at a wavelength of 500 nm and the plot point at a wavelength of 525 nm are connected by a straight line (straight line 3), the plot point at a wavelength of 525 nm and the plot point at a wavelength of 550 nm are connected by a straight line (straight line 4), the plot point at a wavelength of 550 nm and the plot point at a wavelength of 575 nm are connected by a straight line (straight line 5), and the plot point at a wavelength of 575 nm and the plot point at a wavelength of 600 nm are connected by a straight line (straight line 6).

Next, the slope S of each of the obtained straight lines (straight lines 1 to 6) is calculated. In a case where all of the obtained slopes S(each of the slopes S of the straight lines 1 to 6) are more than 0.10 and 1.0 or less, Requirement 6 is satisfied.

Among those, from the viewpoint that the effect of the present invention is more excellent, it is preferable that in a graph where wavelengths of measurement light incident on the second phase difference film are plotted on the horizontal axis and in-plane retardations of the second phase difference film at every 25 nm wavelength of measurement light in a wavelength range of 450 to 650 nm are plotted on the vertical axis, all of slopes S of straight lines connecting two adjacent plot points satisfy Requirement 7.

Requirement 7: $0.10 < \text{Slope } S \leq 1.0$

In order to determine whether or not the requirement of Requirement 7 is satisfied, the in-plane retardations in measurement light at a wavelength of 450 nm, a wavelength of 475 nm, a wavelength of 500 nm, a wavelength of 525 nm, a wavelength of 550 nm, a wavelength of 575 nm, a wavelength of 600 nm, a wavelength of 625 nm, and a wavelength of 650 nm are each determined and plotted on a graph. Then, any of the slope of each of the straight lines 1 to 6, the slope of the straight line (straight line 7) between the plot point at a wavelength of 600 nm and the plot point at a wavelength of 625 nm, and the slope of the straight line (straight line 8) between the plot point at the wavelength of 625 nm and the plot point at the wavelength of 650 nm preferably satisfy Requirement 7.

In addition, from the viewpoint that the effect of the present invention is more excellent, it is preferable that the slope S(550) of the straight line obtained by connecting the plot point at a wavelength of 550 nm of the measurement light and the plot point at a wavelength of 575 nm of the measurement light (a slope S of the straight line 5) satisfies Requirement 8.

Requirement 8: $0.10 < \text{Slope } S(550) < 0.20$

In addition, from the viewpoint that the effect of the present invention is more excellent, it is preferable that the slope S(625) of the straight line obtained by connecting a plot point at a wavelength of 625 nm of the measurement light and a plot point at a wavelength of 650 nm of the measurement light (the slope S of the straight line 8) satisfies Requirement 9.

Requirement 9: $0 < |\text{Slope } S(625) - 0.25| < 0.15$ (Liquid Crystal Compound)

The phase difference film (the first phase difference film and the second phase difference film) is a layer formed of at least a liquid crystal compound. Above all, the phase difference film is preferably a film obtained by homogeneously aligning and fixing a liquid crystal compound.

Furthermore, the mainstream of the organic electroluminescent display panel (organic EL display panel) has been a rigid plane type in the related art. However, in recent years, a foldable flexible organic EL display panel has been proposed. The circularly polarizing plate used for such a flexible organic EL display panel is required to have excellent flexibility itself. From this viewpoint, a phase difference film formed of a liquid crystal compound is more flexible than a polymer film, and therefore, it can be suitably applied to the flexible organic EL display panel.

The type of the liquid crystal compound is not particularly limited, but the polymerizable liquid crystal compounds can be classified into a rod-shaped type (rod-shaped liquid crystal compound) and a disk-shaped type (disk-shaped liquid crystal compound, a discotic liquid crystal compound) based on the shape. Each of the types can further be classified into a low-molecular type and a high-molecular type. The term, high-molecular-weight, generally refers to having a degree of polymerization of 100 or more (Polymer Physics-Phase Transition Dynamics, by Masao Doi, page 2, published by Iwanami Shoten, Publishers, 1992). In addition, two or more kinds of the rod-shaped liquid crystal compounds, two or more kinds of the disk-shaped liquid crystal compounds, or a mixture of the rod-shaped liquid crystal compound and the disk-shaped liquid crystal compound may be used.

From the viewpoint that changes in the temperature and the humidity of the optical characteristics can be suppressed, it is more preferable that a liquid crystal compound (rod-shaped liquid crystal compound or disk-shaped liquid crystal compound) having a polymerizable group is formed of the liquid crystal compound. The liquid crystal compounds may be a mixture of two or more kinds thereof, and in this case, it is preferable that at least one has 2 or more polymerizable groups.

That is, it is preferable that the liquid crystal compound is a layer formed by the fixation of the liquid crystal compound (rod-shaped liquid crystal compound or disk-shaped liquid crystal compound) having a polymerizable group by polymerization or the like, and in this case, it is not necessary to exhibit the liquid crystallinity any longer after forming the layer.

The type of the polymerizable group is not particularly limited, and a polymerizable group which is radically polymerizable or cationically polymerizable is preferable.

A known radically polymerizable group can be used as the radically polymerizable group, and an acryloyl group or a methacryloyl group is preferable.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and the epoxy group, the oxetanyl group, or the vinyloxy group is more preferable.

In particular, preferred examples of the polymerizable group include the following groups.

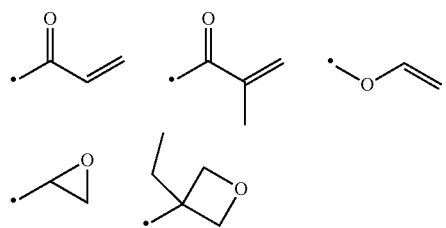

The liquid crystal compound preferably exhibits reciprocal wavelength dispersibility. Further, the expression that liquid crystal compound exhibits reciprocal wavelength dispersibility means that the liquid crystal compound has a main chain mesogen and a side chain mesogen bonded to the main chain mesogen in the molecule, and in a case of being uniformly aligned, the optical axes of the main chain mesogen and the side chain mesogen are aligned in different directions, whereby the compound has a birefringence An exhibiting reciprocal wavelength dispersion characteristics.

That is, the liquid crystal compound with "reciprocal wavelength dispersibility" means that in a case where an in-plane retardation (Re) value at a specific wavelength (visible light range) of an optically anisotropic layer manufactured using the compound is measured, the Re value increases as a measurement wavelength increases.

Furthermore, the main chain mesogen means a mesogen located in the major axis direction in the molecule, and the side chain mesogen means a mesogen which is bonded to the main chain mesogen and whose optical axis extends in a different direction (for example, a direction orthogonal to the major axis direction).

For example, in the compound represented by the following formula, a structure surrounded by a corresponds to the main chain mesogen, and a structure surrounded by b corresponds to the side chain mesogen.

Furthermore, in Formula (I), $A^1$ and $A^2$ each independently represent a single bond, an aromatic ring having 6 or more carbon atoms, or a cycloalkylene ring having 6 or more carbon atoms.

Moreover, in Formula (I), $SP^1$ and $SP^2$ each independently represent a single bond, a linear or branched alkylene group having 1 to 14 carbon atoms, or a divalent linking group in which one or more of —$CH_2$-'s constituting the linear or branched alkylene group having 1 to 14 carbon atoms are substituted with —O—, —S—, —NH—, —N(Q)-, or —CO—, and Q represents a polymerizable group.

Incidentally, in Formula (I), $L^1$ and $L^2$ each independently represent a monovalent organic group (for example, an alkyl group or a polymerizable group).

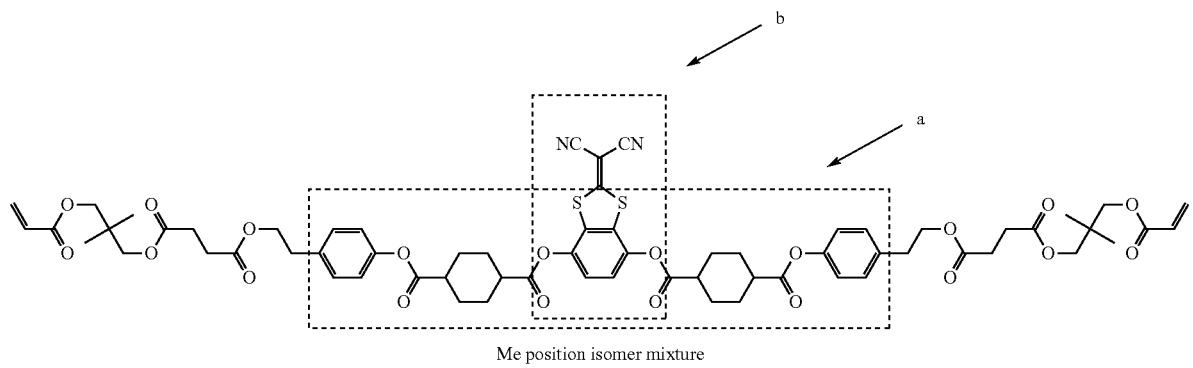 [SMILES: C=CC(=O)OCC(C)(C)COC(=O)CCC(=O)OCCc1ccc(OC(=O)C2CCC(C(=O)Oc3ccc(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

Me position isomer mixture

Among those, a compound represented by Formula (I) is preferable as the liquid crystal compound used at the time of forming a phase difference film.

$$L^1\text{-}SP^1\text{-}A^1\text{-}D^3\text{-}G^1\text{-}D^1\text{-}Ar\text{-}D^2\text{-}G^2\text{-}D^4\text{-}A^2\text{-}SP^2\text{-}L^2 \quad \text{Formula (I)}$$

In Formula (I), $D^1$, $D^2$, $D^3$, and $D^4$ each independently represent a single bond, —O—, —CO—, —O—CO—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—$CR^3R^4$—O—CO—, —$CR^1R^2$—O—CO—$CR^3R^4$—, —$CR^1R^2$—CO—O—$CR^3R^4$—, —$NR^1$—$CR^2R^3$—, or —CO—$NR^1$—.

$R^1$, $R^2$, $R^3$, and $R^4$ each independently represent a hydrogen atom, a fluorine atom, or an alkyl group having 1 to 4 carbon atoms. In a case where a plurality of $R^1$, $R^2$, $R^3$, and $R^4$ are present, the plurality of $R^1$, the plurality of $R^2$, the plurality of $R^3$, and the plurality of $R^4$ may be the same as or different from each other.

In addition, in Formula (I), $G^1$ and $G^2$ each independently represent a divalent alicyclic hydrocarbon group having 5 to 8 carbon atoms, a group formed by linking a plurality of the alicyclic hydrocarbon groups, an aromatic hydrocarbon group, or a group formed by linking a plurality of the aromatic hydrocarbon groups, and one or more of —$CH_2$-'s constituting the alicyclic hydrocarbon group may be substituted with —O—, —S—, or —NH—.

The group formed by linking a plurality of the alicyclic hydrocarbon groups means a group formed by linking the divalent alicyclic hydrocarbon groups having 5 to 8 carbon atoms through a single bond. In addition, the group formed by linking a plurality of the aromatic hydrocarbon groups means a group formed by linking the aromatic hydrocarbon groups through a single bond.

Furthermore, in a case where Ar is a group represented by Formula (Ar-1), a group represented by Formula (Ar-2), a group represented by Formula (Ar-4), a group represented by Formula (Ar-5), a group represented by Formula (Ar-6), or a group represented by Formula (Ar-7), each of which will be described later, at least one of $L^1$ or $L^2$ represents a polymerizable group. In addition, in a case where Ar is a group represented by Formula (Ar-3) which will be described later, at least one of $L^1$ or $L^2$, or $L^3$ or $L^4$ in Formula (Ar-3) represents a polymerizable group.

In Formula (I), a 5- or 6-membered ring is preferable as the divalent alicyclic hydrocarbon group having 5 to 8 carbon atoms represented by each of $G^1$ and $G^2$. Further, the alicyclic hydrocarbon group may be either a saturated alicyclic hydrocarbon group or an unsaturated alicyclic hydrocarbon group, but is preferably the saturated alicyclic hydrocarbon group. With respect to the divalent alicyclic hydrocarbon group represented by each of $G^1$ and $G^2$, reference can be made to, for example, the description in paragraph 0078 of JP2012-021068A, the contents of which are incorporated herein by reference.

In Formula (I), examples of the aromatic ring having 6 or more carbon atoms represented by each of $A^1$ and $A^2$ include aromatic hydrocarbon rings such as a benzene ring, a naphthalene ring, an anthracene ring, and a phenanthroline ring; and aromatic heterocyclic rings such as a furan ring, a pyrrole ring, a thiophene ring, a pyridine ring, a thiazole ring, and a benzothiazole ring. Among those, the benzene ring (for example, a 1,4-phenyl group) is preferable.

Furthermore, in Formula (I), examples of the cycloalkylene ring having 6 or more carbon atoms represented by each of $A^1$ and $A^2$ include a cyclohexane ring and a cyclohexene ring, and among these, the cyclohexane ring (for example, a cyclohexane-1,4-diyl group) is preferable.

In Formula (I), as the linear or branched alkylene group having 1 to 14 carbon atoms represented by each of $SP^1$ and $SP^2$, a methylene group, an ethylene group, a propylene group, or a butylene group is preferable.

In Formula (I), the polymerizable group represented by each of $L^1$ and $L^2$ is not particularly limited, but a radically polymerizable group (a group which is radically polymerizable) or a cationically polymerizable group (a group which is cationically polymerizable) is preferable.

A suitable range of the radically polymerizable group is as described above.

On the other hand, in Formula (I), Ar represents any aromatic ring selected from the group consisting of groups represented by Formulae (Ar-1) to (Ar-7). In addition, in Formulae (Ar-1) to (Ar-7), *1 represents a bonding position with $D^1$ and *2 represents a bonding position with $D^2$.

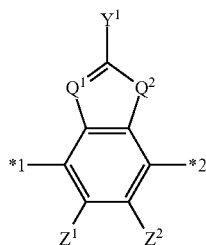
(Ar-1)

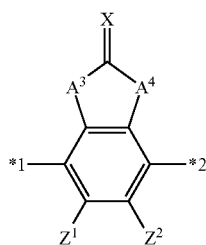
(Ar-2)

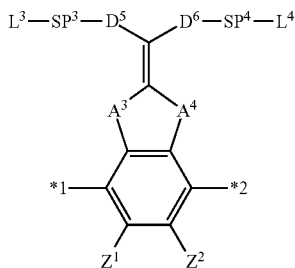
(Ar-3)

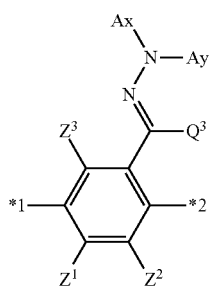
(Ar-4)

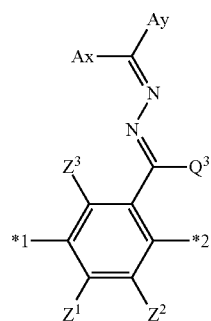
(Ar-5)

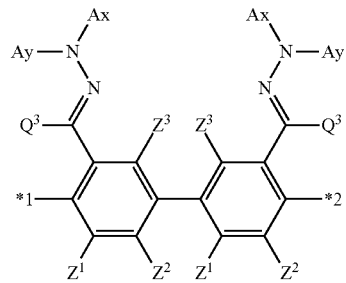
(Ar-6)

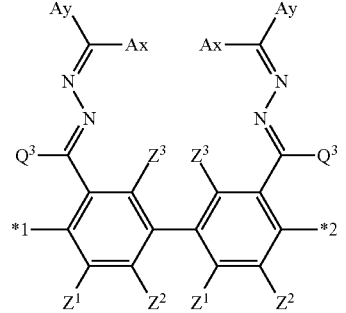
(Ar-7)

Here, in Formula (Ar-1), $Q^1$ represents N or CH, $Q^2$ represents —S—, —O—, or —N($R^5$)—, $R^5$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, each of which may have a substituent.

Examples of the alkyl group having 1 to 6 carbon atoms represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms represented by $Y^1$ include aryl groups such as a phenyl group, a 2,6-diethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, a pyridyl group, and a benzofuryl group. Further, examples of the aromatic heterocyclic group further include a group formed by fusion of a benzene ring and an aromatic heterocyclic ring.

In addition, examples of the substituent which may be contained in $Y^1$ include an alkyl group, an alkoxy group, a nitro group, an alkylsulfonyl group, an alkyloxycarbonyl group, a cyano group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and the fluorine atom or the chlorine atom is preferable.

In addition, in Formulae (Ar-1) to (Ar-7), Z, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$NR^6R^7$, or —SRI, $R^6$ to $R^8$ each independently represent a hydrogen atom or an alkyl group having 1 to 6 carbon atoms, and $Z^1$ and $Z^2$ may be bonded to each other to form a ring. The ring may be any one of an alicyclic ring, a heterocyclic ring, and an aromatic ring, and is preferably the aromatic ring. In addition, a ring thus formed may be substituted with a substituent.

As the monovalent aliphatic hydrocarbon group having 1 to 20 carbon atoms, an alkyl group having 1 to 15 carbon atoms is preferable, an alkyl group having 1 to 8 carbon atoms is more preferable, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and ethylcyclohexyl group; a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadienyl group; and a polycyclic saturated hydrocarbon group such as a bicyclo[2.2.1]heptyl group, a bicyclo[2.2.2]octyl group, a tricyclo[5.2.1.0'$^6$]decyl group, a tricyclo[3.3.1.1$^{3,7}$]decyl group, a tetracyclo[6.2.1.1$^{3,6}$.0$^{2,7}$]dodecyl group, and an adamantyl group.

Examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the halogen atom include a fluorine atom, a chlorine atom, a bromine atom, and an iodine atom, and the fluorine atom, the chlorine atom, or the bromine atom is preferable.

On the other hand, examples of the alkyl group having 1 to 6 carbon atoms represented by each of $R^6$ to $R^8$ include a methyl group, an ethyl group, a propyl group, an isopropyl group, an n-butyl group, an isobutyl group, a sec-butyl group, a tert-butyl group, an n-pentyl group, and an n-hexyl group.

In addition, in Formulae (Ar-2) and (Ar-3), $A^3$ and $A^1$ each independently represent a group selected from the group consisting of —O—, —$N(R^9)$—, —S—, and —CO—, and $R^9$ represents a hydrogen atom or a substituent.

Examples of the substituent represented by $R^9$ include the same ones as the substituents which may be contained in $Y^1$ in Formula (Ar-1).

Furthermore, in Formula (Ar-2), X represents a hydrogen atom or a non-metal atom of Groups XIV to XVI, to which a substituent may be bonded.

Moreover, examples of the non-metal atom of Groups 14 to 16 represented by X include an oxygen atom, a sulfur atom, a nitrogen atom having a substituent, and a carbon atom having a substituent, and examples of the substituent include the same ones as the substituents which may be contained in $Y^1$ in Formula (Ar-1).

In addition, in Formula (Ar-3), $D^5$ and $D^6$ each independently represent a single bond, —CO—, —O—, —S—, —C(=S)—, —O—CO—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

Moreover, in Formula (Ar-3), $SP^3$ and $SP^4$ each independently represent a single bond, a linear or branched alkylene group having 1 to 12 carbon atoms, or a divalent linking group in which one or more of —$CH_2$-'s constituting the linear or branched alkylene group having 1 to 12 carbon atoms are substituted with —O—, —S—, —NH—, —N(Q)-, or —CO—, and Q represents a polymerizable group.

Furthermore, in Formula (Ar-3), La and $L^1$ each independently represent a monovalent organic group (for example, an alkyl group and a polymerizable group), and at least one of $L^3$ or $L^4$, or L or $L^2$ in Formula (I) represents a polymerizable group.

Examples of the monovalent organic group other than a polymerizable group include an alkyl group, an aryl group, and a heteroaryl group.

Moreover, in Formulae (Ar-4) and (Ar-7), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-7), Ay represents a hydrogen atom, an alkyl group having 1 to 6 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom or an alkyl group having 1 to 6 carbon atoms, which may have a substituent.

Examples of each of Ax and Ay include those described in paragraphs 0039 to 0095 of the pamphlet of WO2014/010325A.

Incidentally, examples of the alkyl group having 1 to 6 carbon atoms represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in $Y^1$ in Formula (Ar-1).

Among those, from the viewpoint that the effect of the present invention is more excellent, it is preferable that at least one of $A^1$ or $A^2$ is a cycloalkylene ring having 6 or more carbon atoms, and it is more preferable that one of $A^1$ and $A^2$ is a cycloalkylene ring having 6 or more carbon atoms.

(Coloring Agent)

The phase difference film may be formed using a combination of components other than the liquid crystal compound. That is, the phase difference film may include components other than components derived from the liquid crystal compound.

For example, the phase difference film may include a coloring agent. That is, the phase difference film may be a layer formed of a composition including a liquid crystal compound and a coloring agent.

By incorporating the coloring agent, the wavelength dispersibility of the phase difference film can be controlled.

Hereinafter, first, a case where the phase difference film includes an infrared my-absorbing coloring agent will be described in detail as an example.

Figure 3:
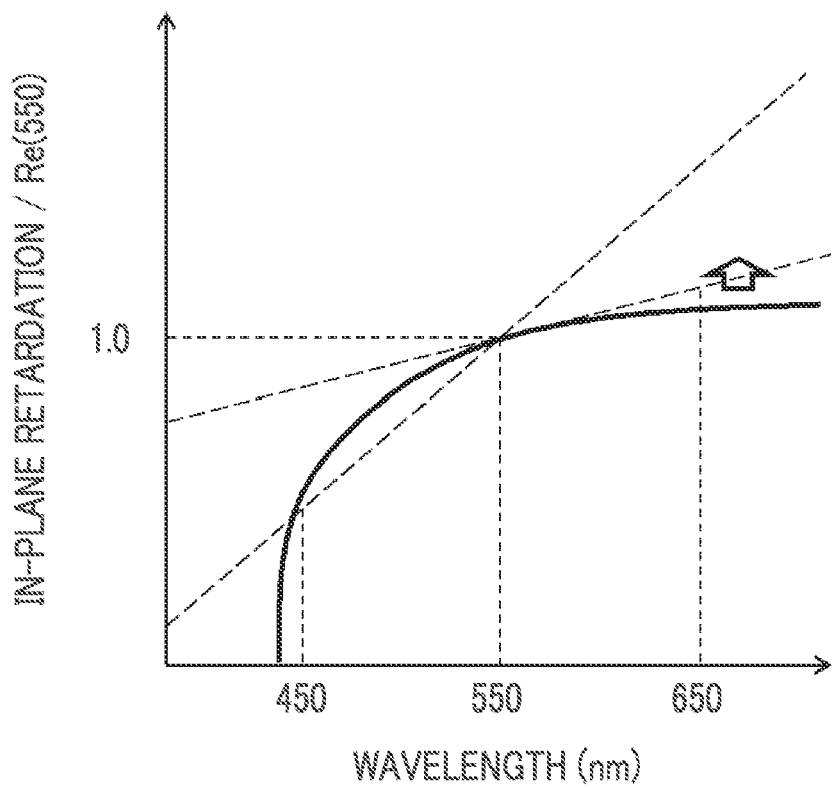
FIG. 3 is a view showing a change in the wavelength dispersion of a phase difference film in a case where an infrared ray-absorbing coloring agent is used.

First, the wavelength dispersion characteristics of the in-plane retardation at each wavelength in the visible light region standardized with the in-plane retardation at a measurement wavelength of 550 nm set to 1.0 is shown in FIG. 3, in which straight lines corresponding to the above-mentioned Requirements 2 and 3 are shown with broken lines. For example, a phase difference film exhibiting reciprocal wavelength dispersibility in the related art satisfies Requirements 2 and 3 in a short wavelength range of 550 nm or less, but shows a tendency not to satisfy Requirements 2 and 3 in a long wavelength range of 550 nm or more in many cases, as shown by the solid line in FIG. 3.

In the phase difference film of the embodiment of the present invention, it is possible to adjust optical characteristics in a long wavelength range to satisfy Requirements 2 and 3 as indicated by a white arrow by using an infrared ray-absorbing coloring agent and controlling the absorption characteristics of the phase difference film at a wavelength of 700 to 900 nm.

Figure 4:
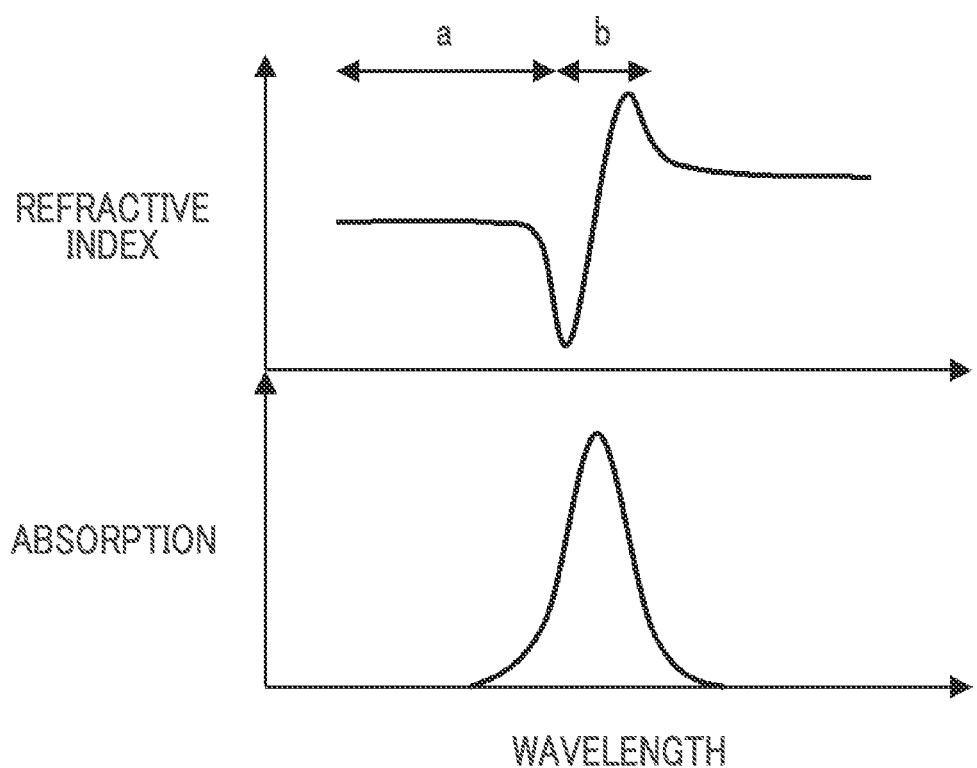
FIG. 4 is a view showing the wavelength dispersion characteristics with respect to a refractive index and an absorption coefficient of an organic molecule.

A reason why the characteristics are obtained will firstly be described with reference to FIG. 4 with regard the refractive index wavelength dispersion characteristics of a general organic molecules will be described. In FIG. 4, the upper side shows the behavior of a refractive index with respect to a wavelength, and the lower side shows a behavior (absorption spectrum) of absorption characteristics with respect to the wavelength.

For the organic molecule, a refractive index n in a region (a region a in FIG. 4) away from the intrinsic absorption wavelength decreases monotonically as the wavelength increases. Such the dispersion is referred to as "normal dispersion". In contrast, a refractive index n in a wavelength band including an intrinsic absorption (a region b in FIG. 4) rapidly increases as the wavelength increases. Such the dispersion is referred to as "anomalous dispersion". That is, as shown in FIG. 4, an increase or decrease in the refractive index is observed immediately before the wavelength range with the absorption.

By using an infrared ray-absorbing coloring agent and controlling an alignment direction thereof, an absorption at a wavelength of 700 to 900 nm in the direction of the fast axis of the phase difference film is larger than an absorption at a wavelength of 700 to 900 nm in the direction of the slow axis of the phase difference film due to an effect of the infrared ray-absorbing coloring agent on the phase difference film. Hereinafter, such absorption characteristics are also referred to as absorption characteristics X. The absorption characteristics X are accomplished by arranging the axial direction in which the infrared ray-absorbing coloring agent has a high absorbance in the phase difference film to be in parallel with the fast axis direction of the phase difference film.

In the phase difference film exhibiting the absorption characteristics X, the ordinary ray refractive index is further reduced, as compared with the phase difference film not having the absorption characteristics X.

Figure 5:
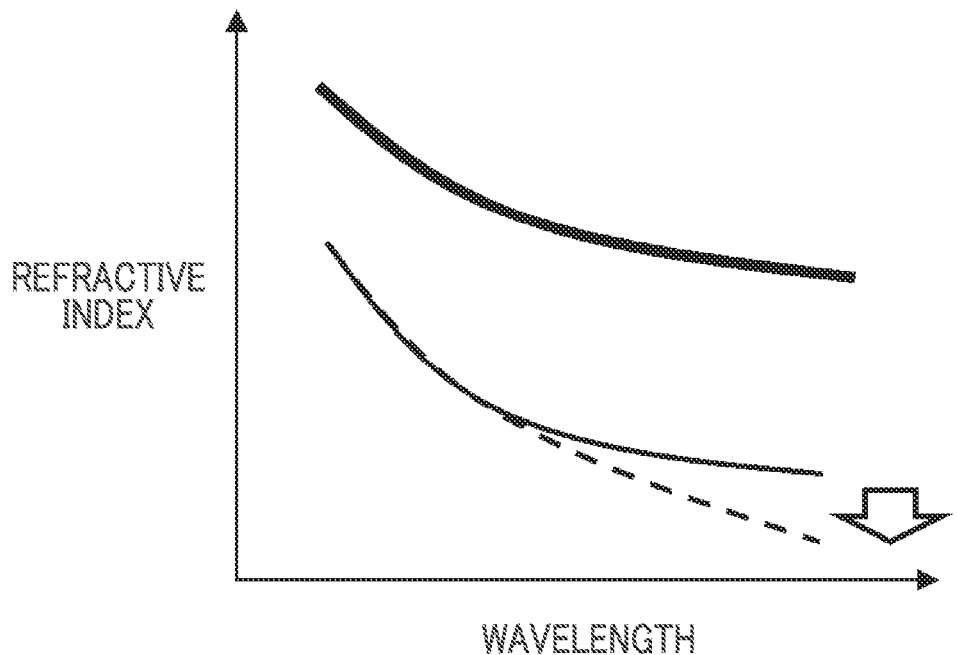
FIG. 5 is a view showing a comparison of the wavelength dispersion between an extraordinary ray refractive index ne and an ordinary ray refractive index no depending on the presence or absence of predetermined absorption characteristics.

Specifically, FIG. 5 is a view showing a comparison of the wavelength dispersion between an extraordinary ray refractive index ne and an ordinary ray refractive index no depending on the presence or absence of the absorption characteristics X. In FIG. 5, the thick line indicates a curve of the extraordinary ray refractive index ne in the absence of the absorption characteristics X, and the solid line shows a curve of the ordinary ray refractive index no in the absence of the absorption characteristics X. In contrast, in the phase difference film having the absorption characteristics X, a value of the ordinary ray refractive index no in the long wavelength range in the visible light region is further reduced as shown with a broken line under the influence derived from an absorption at a wavelength of 700 to 900 nm as shown in FIG. 4. As a result, a birefringence Δn which is a difference between the extraordinary ray refractive index ne and the ordinary ray refractive index no is larger in the long wavelength range in the visible light region, and thus, the behavior indicated with the arrow shown in FIG. 3 is accomplished, thereby obtaining a phase difference film that satisfies the above-mentioned Requirements 2 and 3 (or Requirement 6).

Figure 6:
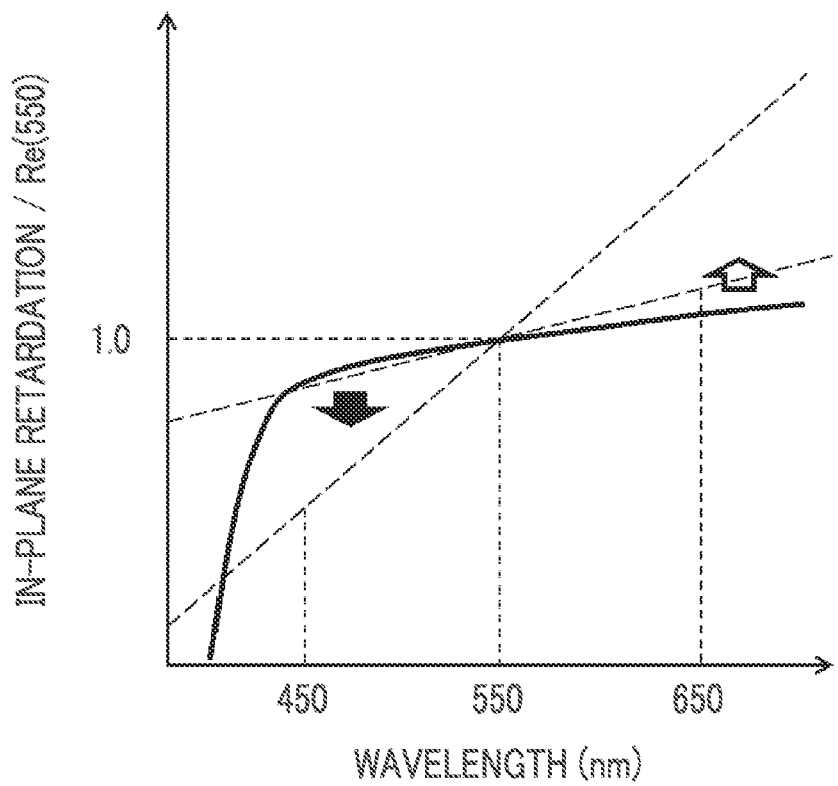
FIG. 6 is a view showing a change in the wavelength dispersion of a phase difference film in a case where a dichroic coloring agent having a maximum absorption wavelength in the visible light region is used.
Figure 7:
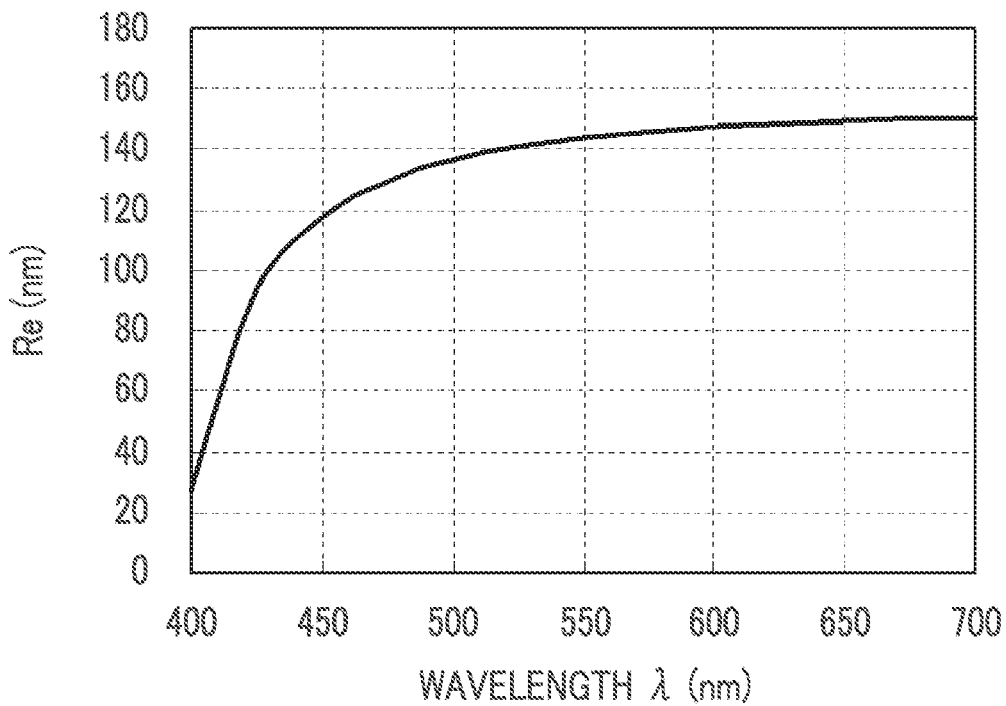
FIG. 7 is a view showing the wavelength dispersion characteristics of a phase difference film A-1.
Figure 8:
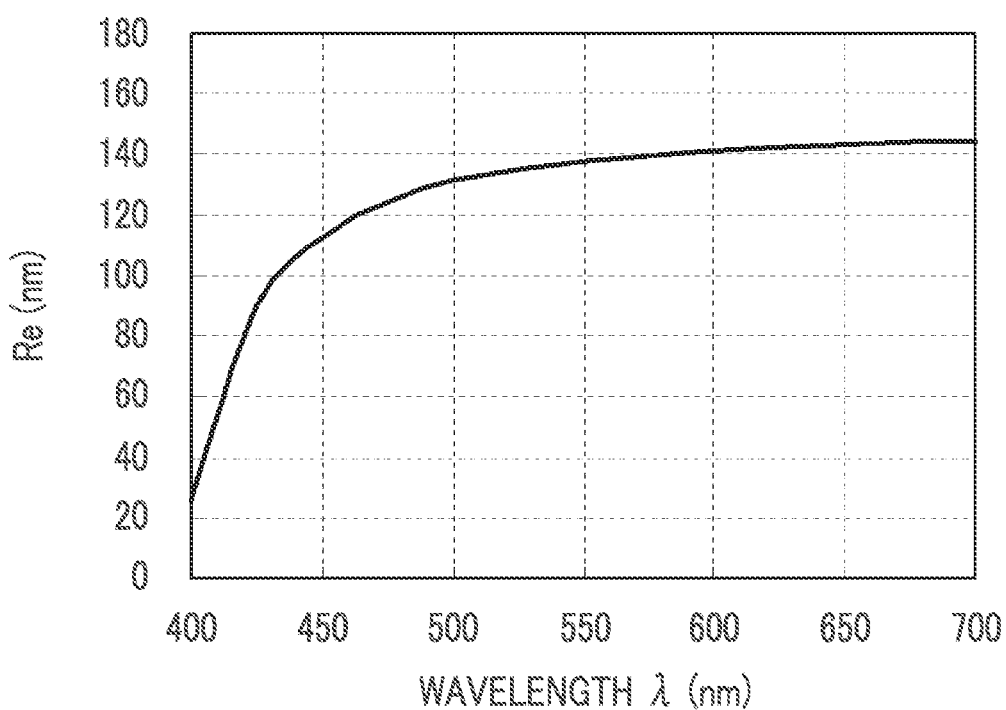
FIG. 8 is a view showing the wavelength dispersion characteristics of a phase difference film A-2.
Figure 9:
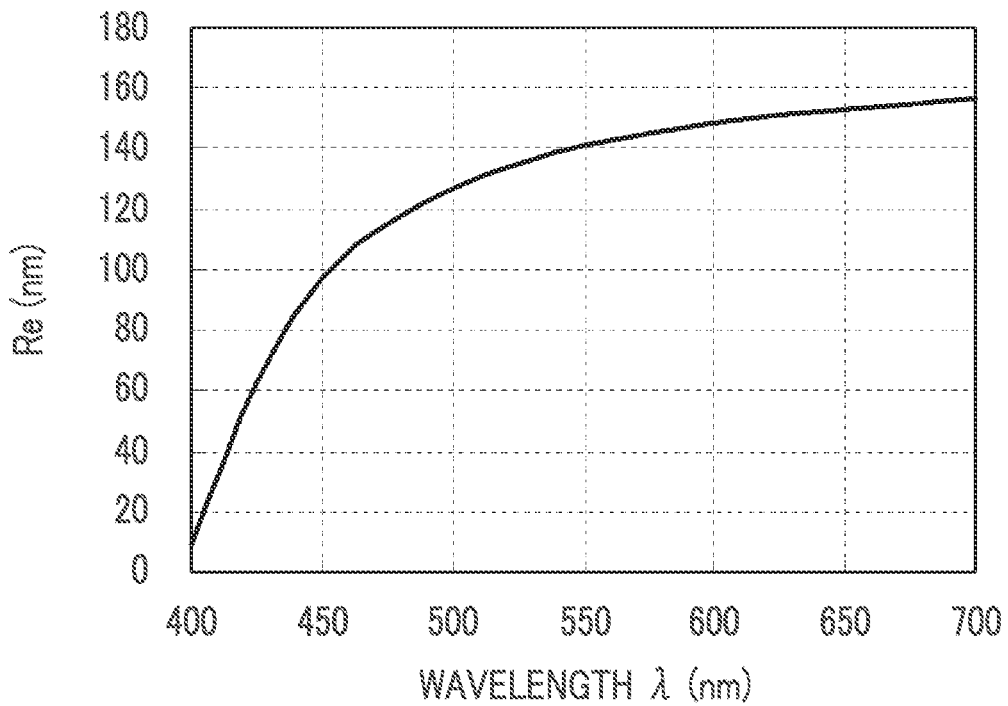
FIG. 9 is a view showing the wavelength dispersion characteristics of the phase difference film A-3.
Figure 10:
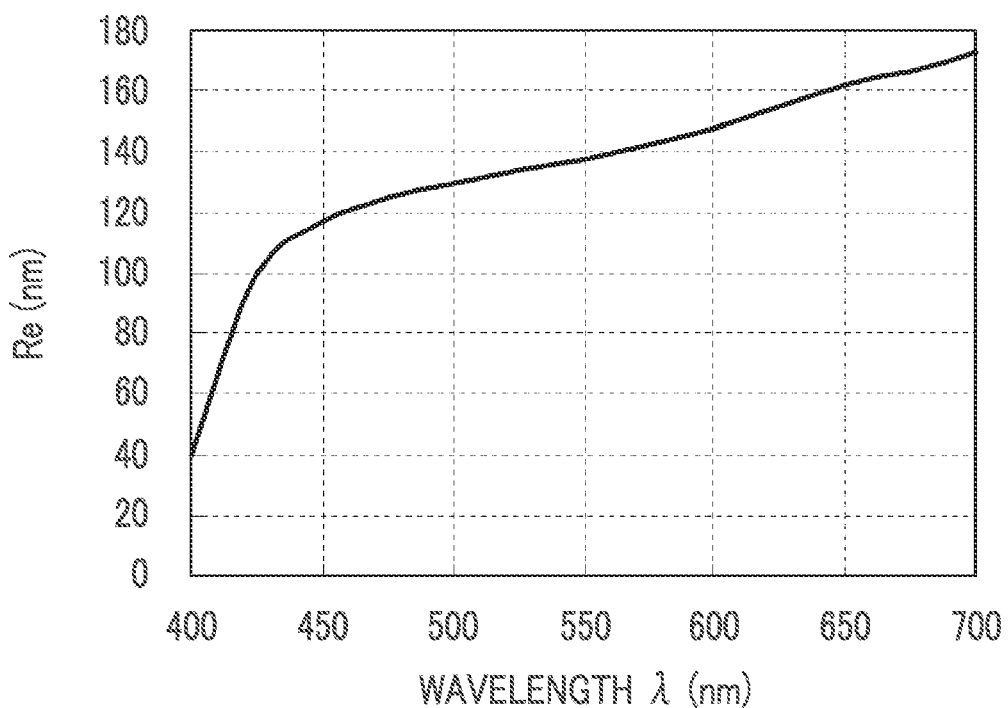
FIG. 10 is a view showing the wavelength dispersion characteristics of a phase difference film A-4.
Figure 11:
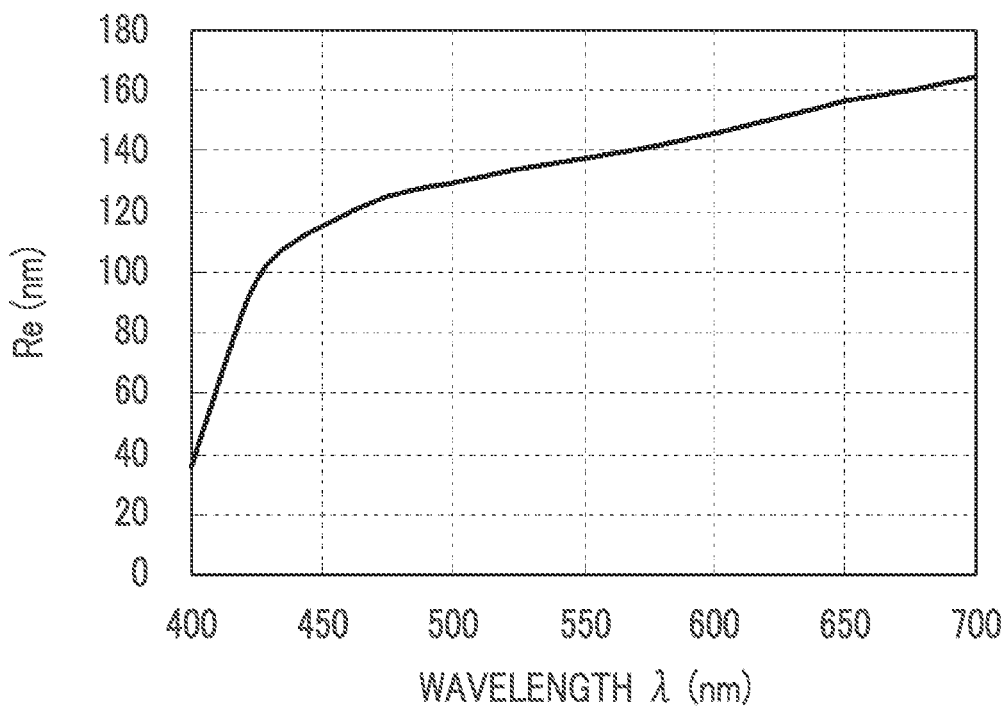
FIG. 11 is a view showing the wavelength dispersion characteristics of a phase difference film A-5.
Figure 12:
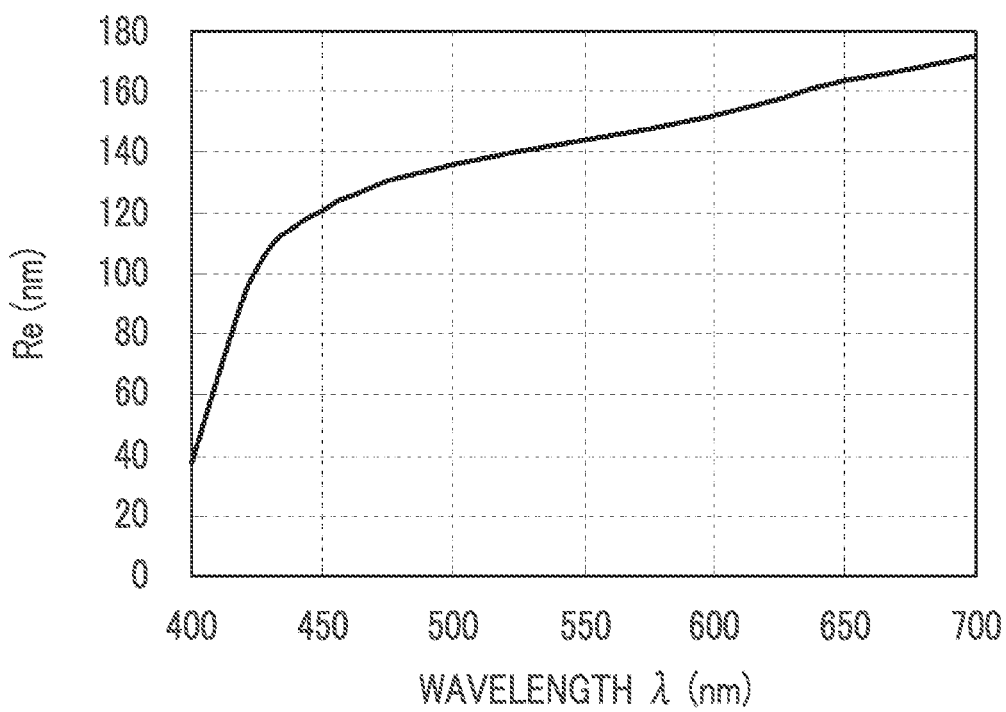
FIG. 12 is a view showing the wavelength dispersion characteristics of a phase difference film A-6.
Figure 13:
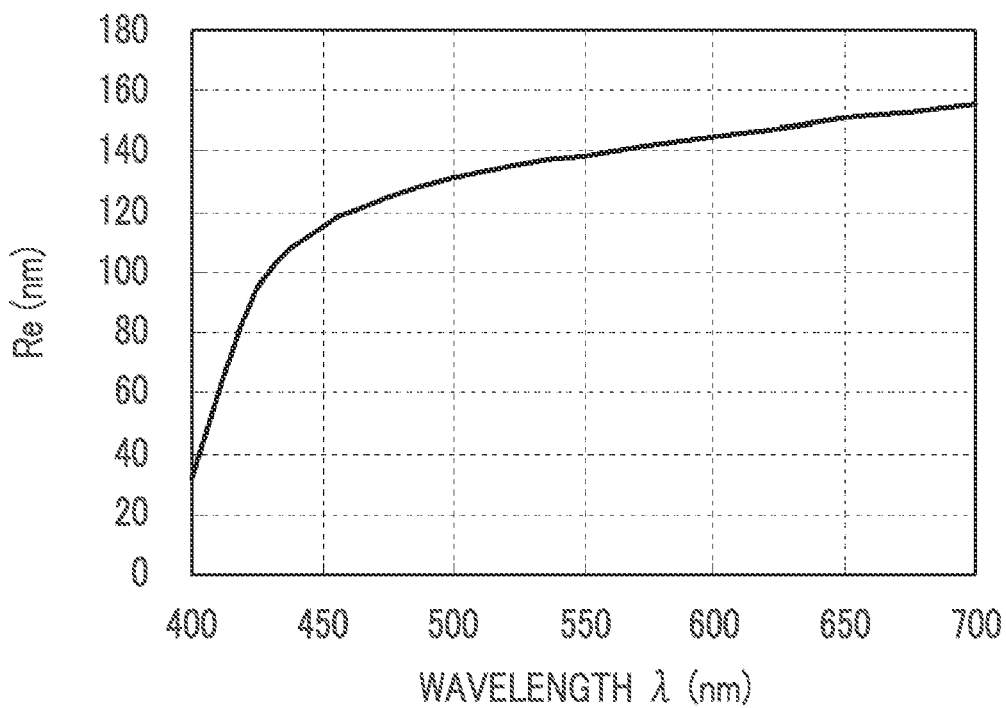
FIG. 13 is a view showing the wavelength dispersion characteristics of a phase difference film A-7.
Figure 14:
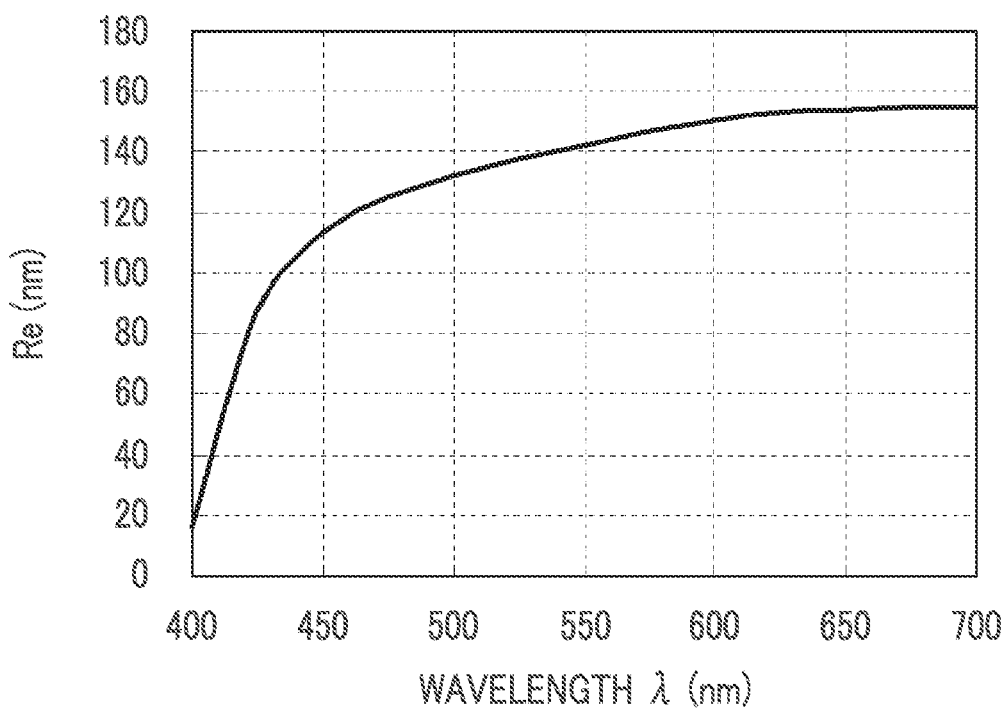
FIG. 14 is a view showing the wavelength dispersion characteristics of a phase difference film A-8.
Figure 15:
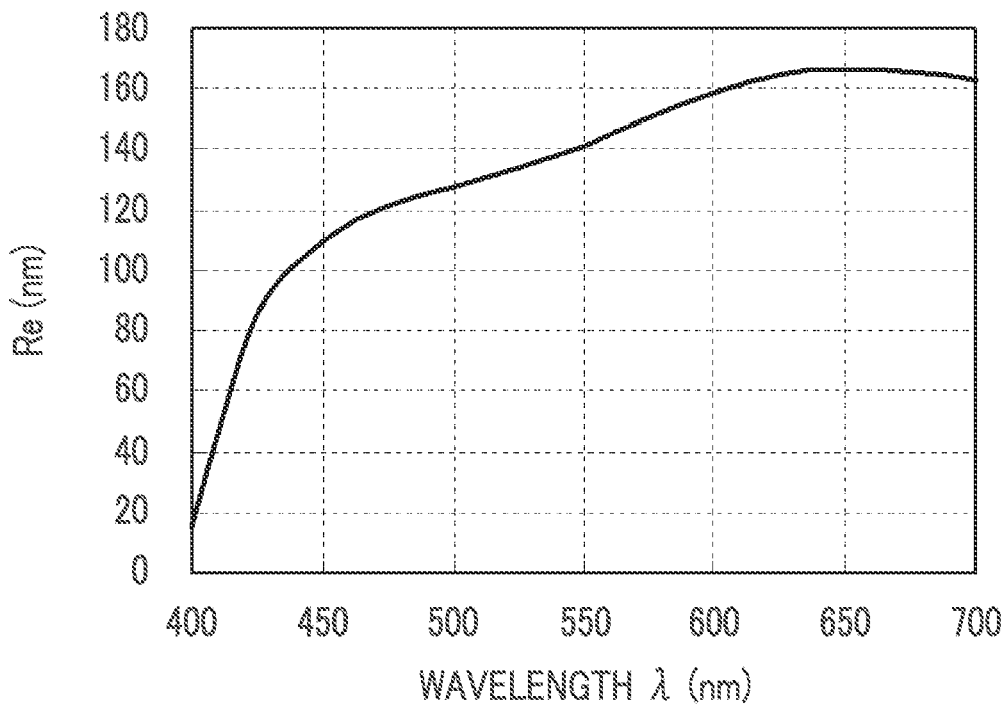
FIG. 15 is a view showing the wavelength dispersion characteristics of a phase difference film A-9.
Figure 16:
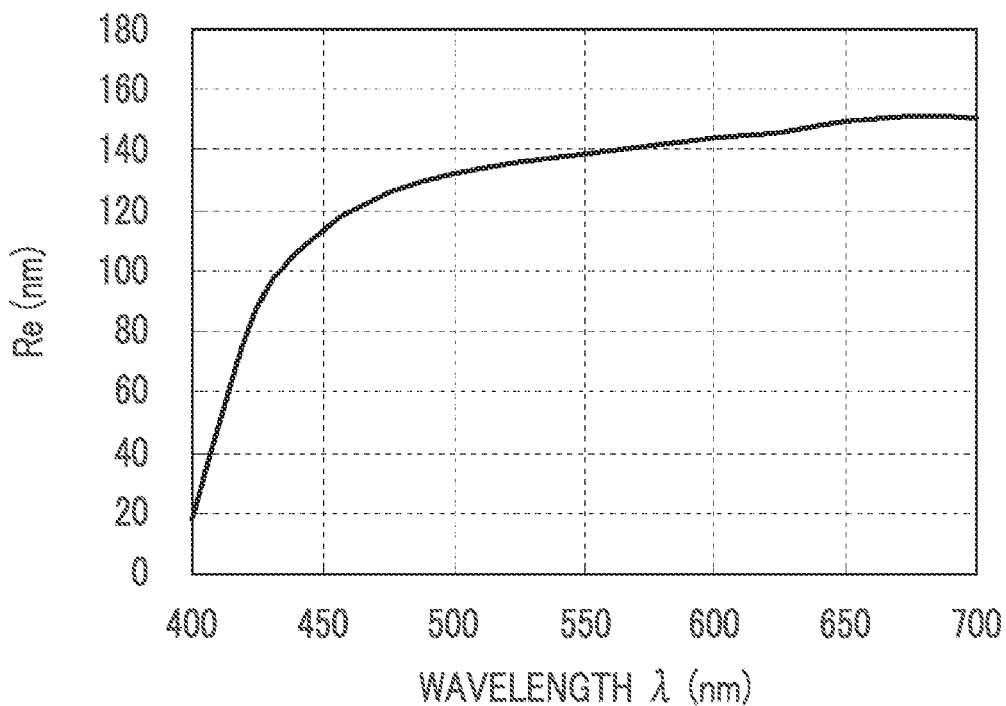
FIG. 16 is a view showing the wavelength dispersion characteristics of a phase difference film A-10.
Figure 17:
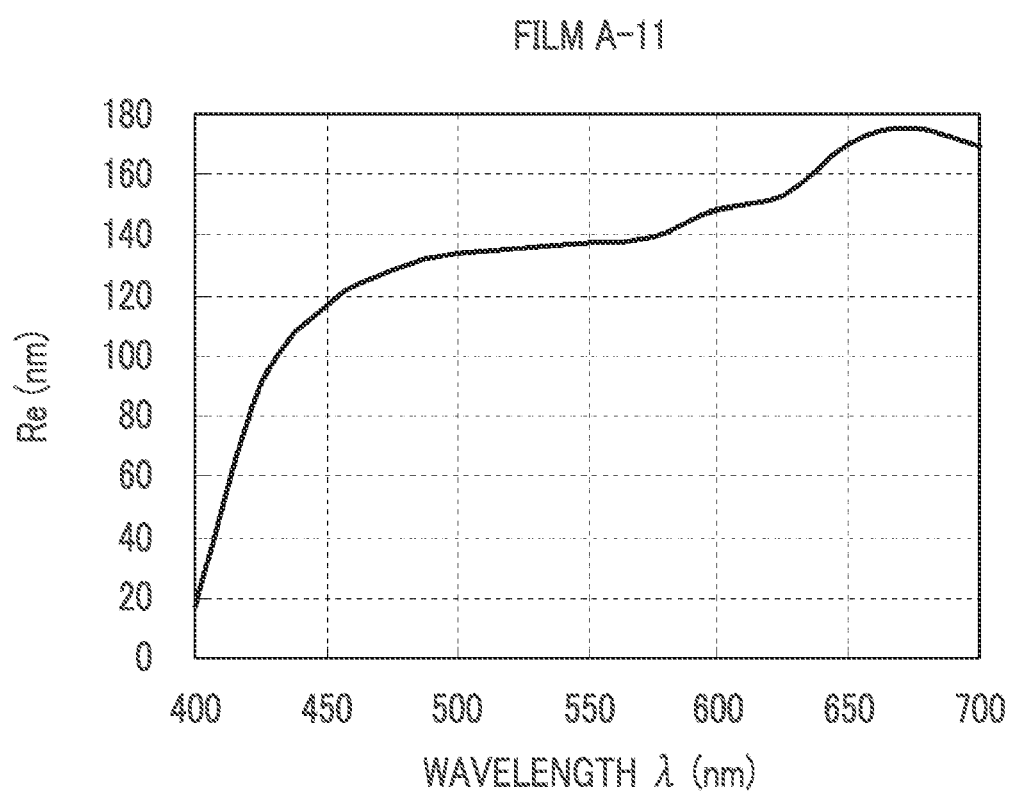
FIG. 17 is a view showing the wavelength dispersion characteristics of a phase difference film A-11.

Furthermore, although a form in which an infrared ray-absorbing coloring agent is used has been described above, the form is not restrictive, and a form in which a dichroic coloring agent having a maximum absorption wavelength in the visible light region (hereinafter also referred to as "a visible light-absorbing dichroic coloring agent") is used may be mentioned. In a case where the visible light-absorbing dichroic coloring agent is present in the phase difference film, it affects the wavelength dispersibility of the phase difference film as in the case where the above-mentioned infrared ray-absorbing coloring agent is used. For example, in a case where a phase difference film is manufactured using a dichroic coloring agent having a maximum absorption wavelength near 550 nm together with a liquid crystal compound, due to an effect of the refractive index wavelength dispersion characteristics shown in FIG. 4, it is possible to obtain a phase difference film that satisfies the above-mentioned Requirements 2 and 3 (or Requirement 6), in which a curve line moves in the direction of a black arrow in the short wavelength range of 550 nm or less while the curve line moves in the direction of a white arrow in the long wavelength range of 550 nm or more, in contrast to the wavelength dispersion characteristics (shown by the solid line in FIG. 6) of the phase difference film manufactured without using a dichroic coloring agent having a maximum absorption wavelength near 550 nm, as shown in FIG. 6.

Hereinafter, a form of the coloring agent will be described in separation into a form of the infrared ray-absorbing coloring agent and a form of the visible light-absorbing dichroic coloring agent.

The infrared ray-absorbing coloring agent is not particularly limited as long as it is a coloring agent which absorbs infrared rays (in particular, light at a wavelength of 700 to 900 nm). Among those, the infrared ray-absorbing coloring agent is preferably a dichroic coloring agent. Further, the dichroic coloring agent refers to a coloring agent having a property that an absorbance in the major axis direction and an absorbance in the minor axis direction in the molecule are different from each other.

Examples of the infrared ray-absorbing coloring agent include a diketopyrrolopyrrole-based coloring agent, a diimmonium-based coloring agent, a phthalocyanine-based coloring agent, a naphthalocyanine-based coloring agent, an azo-based coloring agent, a polymethine-based coloring agent, an anthraquinone-based coloring agent, a pyrylium-based coloring agent, a squarylium-based coloring agent, a triphenylmethane-based coloring agent, a cyanine-based coloring agent, and an aminium-based coloring agent.

The infrared ray-absorbing coloring agents may be used singly or in combination of two or more kinds thereof.

From the viewpoint that the effect of the present invention is more excellent, it is preferable that the infrared ray-absorbing coloring agent has a mesogenic group. By incorporating the mesogenic group into the infrared ray-absorbing coloring agent, the infrared ray-absorbing coloring agent can be easily aligned with the above-mentioned liquid crystal compounds described and predetermined absorption characteristics can be easily controlled.

The mesogenic group is a functional group which is rigid and has alignment. Examples of a structure of the mesogenic groups include a structure formed by linking a plurality of groups selected from the group consisting of an aromatic ring group (an aromatic hydrocarbon ring group and an aromatic heterocyclic group) and an alicyclic group directly or via a linking group (for example, CO—, —O—, and —NR— (R represents a hydrogen atom or an alkyl group), or a group formed by combination of these groups).

From the viewpoint that the effect of the present invention is more excellent, the maximum absorption wavelength of the infrared ray-absorbing coloring agent is preferably positioned at 700 to 900 nm.

Suitable forms of the infrared ray-absorbing coloring agent include a compound represented by Formula (1).

The compound represented by Formula (1) has a less absorption in the visible light region, and a phase difference film thus obtained is further suppressed from being colored. In addition, since the compound includes a group having a mesogenic group, it is easily aligned together with the liquid crystal compound. At this time, the group having a mesogenic group is arranged such that it extends horizontally from a fused ring moiety including a nitrogen atom at the center of the compound, and therefore, the fused ring moiety is easily aligned in the direction perpendicular to the slow axis of a phase difference film thus formed. That is, an absorption in the infrared region (in particular, at a wavelength of 700 to 900 nm) derived from the fused ring moiety is easily obtained in the direction perpendicular to the slow axis of the phase difference film, and a phase difference film exhibiting desired characteristics is easily obtained.

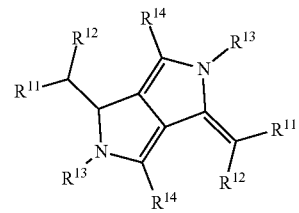

Formula (1)

$R^{11}$ and $R^{12}$ each independently represent a hydrogen atom or a substituent, at least one thereof is an electron-withdrawing group, and $R^{11}$ and $R^{12}$ may be bonded to each other to form a ring.

Examples of the substituent include an alkyl group, an alkenyl group, an alkynyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, an aromatic heterocyclic thio group, a sulfonyl group, a sulfinyl group, a ureido group, a phosphoric acid amide group, a hydroxy group, a mercapto group, a halogen atom, a cyano group, a sulfo group, a carboxyl group, a nitro group, a hydroxamic acid group, a sulfino group, a hydrazino group, an imino group, a heterocyclic group (for example, a heteroaryl group), a silyl group, and a group formed by combination of these groups. Further, the substituent may further be substituted with a substituent.

Furthermore, as the substituent represented by each of $R^{11}$ and $R^{12}$, a group other than the group having a mesogenic group which will be described later is preferable.

The electron-withdrawing group represents a substituent having a Hammett sigma para value (σp value) of positive, and examples thereof include a cyano group, an acyl group, an alkyloxycarbonyl group, an aryloxycarbonyl group, a sulfamoyl group, a sulfinyl group, and a heterocyclic group.

These electron-withdrawing groups may further be substituted.

Here, the Hammett substituent constant value σp will be described. The Hammett rule is an empirical rule proposed by L. P. Hammett in 1935 in order to quantitatively discuss an influence of a substituent exerted on a reaction or equilibrium of a benzene derivative, and nowadays, its validity has been widely recognized. The substituent constants required by the Hammett rule include a σp value and a σm value, and these values are described in many general scientific articles. There are specific descriptions in, for example, "Lange's Handbook of Chemistry" edited by J. A. Dean, 12th edition, 1979 (McGraw-Hill), "Region of Chemistry", extra number, No. 122, pp. 96-103, 1979 (Nankodo Co., Ltd.), Chem. Rev., 1991, Vol. 91, pp. 165-195, and the like. As the electron-withdrawing group in the embodiment of the present invention, a substituent having a Hammett substituent constant σp value of 0.20 or more is preferable. The σp value is preferably 0.25 or more, more preferably 0.30 or more, and still more preferably 0.35 or more. The upper limit is not particularly limited, but is preferably 0.80 or less.

Specific examples thereof include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH2: 0.36), an alkylcarbonyl group (—COMe: 0.50), an arylcarbonyl group (—COPh: 0.43), an alkylsulfonyl group (—SO₂Me: 0.72), and an arylsulfonyl group (—SO₂Ph: 0.68).

In the present specification, Me represents a methyl group and Ph represents a phenyl group. Further, the values in parentheses are σp values of the representative substituent as extracted from Chem. Rev., 1991, Vol. 91, pp. 165-195.

In a case where $R^{11}$ and $R^{12}$ are bonded to form a ring, $R^{11}$ and $R^{12}$ form a 5- to 7-membered ring (preferably a 5- or 6-membered ring), and it is typically preferable to use a ring thus formed as an acidic nucleus in a merocyanine coloring agent.

As the ring formed by the bonding of $R^{11}$ and $R^{12}$, a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus is preferable.

$R^{11}$ is preferably a heterocyclic group, and more preferably an aromatic heterocyclic group. The heterocyclic group may be either a monocycle or a polycycle. As the heterocyclic group, a pyrazole ring group, a thiazole ring group, an oxazole ring group, an imidazole ring group, an oxadiazole ring group, a thiadiazole ring group, a triazole ring group, a pyridine ring group, a pyridazine ring group, a pyrimidine ring group, a pyrazine ring group, such the benzo-fused ring group (for example, a benzothiazole ring group and a benzopyrazine ring group) or a naphtho-fused ring group, or a composite of these fused rings is preferable.

The heterocyclic group may be substituted with a substituent. Examples of the substituent include the examples of the substituent exemplified as the substituent represented by each of $R^{11}$ and $R^{12}$.

$R^{13}$'s each independently represent a hydrogen atom, an alkyl group, an aryl group, a heteroaryl group, a substituted boron (—B(Ra)₂, in which Ra represents a substituent), or a metal atom, or may be covalently bonded or coordinately bonded with $R^{11}$.

The substituent of the substituted boron represented by $R^{11}$ has the same definition as the above-mentioned substituent for each of $R^{11}$ and $R^{12}$, and is preferably an alkyl group, an aryl group, or a heteroaryl group. The substituent of the substituted boron (for example, the above-mentioned alkyl group, aryl group, or heteroaryl group) may further be substituted with a substituent. Examples of the substituent include the groups exemplified as the substituent represented by each of $R^{11}$ and $R^{12}$.

In addition, the metal atom represented by $R^{13}$ is preferably a transition metal atom, a magnesium atom, an aluminum atom, a calcium atom, a barium atom, a zinc atom, or a tin atom, and more preferably the aluminum atom, the zinc atom, the tin atom, the vanadium atom, the iron atom, the cobalt atom, the nickel atom, the copper atom, the palladium atom, the iridium atom, or the platinum atom.

$R^{14}$'s each independently represent a group having a mesogenic group. The mesogenic group has the same definition as above.

$R^{14}$ is preferably a group represented by Formula (2). * represents a bonding position.

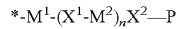  Formula (2)

$M^1$ represents a substituted or unsubstituted arylene group, or a substituted or unsubstituted heteroarylene group. Examples of the arylene group include a phenylene group. Examples of the heteroarylene group include a divalent group obtained by removing any two hydrogen atoms from a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, such the benzo-fused ring (for example, a benzothiazole ring and a benzopyrazine ring) or a naphtho-fused ring, or a composite of these fused rings. In a case where the arylene group and the heteroarylene group have a substituent, examples of the substituent include the groups exemplified as the substituent represented by each of $R^{11}$ and $R^{12}$.

$X^1$ represents a single bond, —O—, —CO—, —C(R⁰)₂—, —CH═CH—, —CH═N—, —N═N—, —C≡C—, —$N^{RO}$—, or a combination thereof (for example, —COO—, —CONR⁰—, —COOCH₂CH₂—, —CONRCH₂CH₂—, —OCOCH═CH—, and —C≡C—C≡C—). $R^0$ represents a hydrogen atom or an alkyl group having 1 to 5 carbon atoms.

$M^2$ represents a substituted or unsubstituted arylene group, a substituted or unsubstituted heteroarylene group, or a substituted or unsubstituted cycloalkylene group. Examples of the arylene group include a phenylene group. Examples of the heteroarylene group include a divalent group obtained by removing any two hydrogen atoms from a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, such the benzo-fused ring (for example, a benzothiazole ring and a benzopyrazine ring) or a naphtho-fused ring, or a composite of these fused rings. The number of carbon atoms included in the cycloalkylene group is preferably 5 to 7. In a case where the arylene group, the heteroarylene group, and the cycloalkylene group have a substituent, examples of the substituent include the groups exemplified as the substituent represented by each of $R^{11}$ and $R^{12}$.

$X^2$ represents a single bond or a divalent linking group. Examples of the divalent linking group include a divalent hydrocarbon group (for example, a divalent aliphatic hydrocarbon group such as an alkylene group having 1 to 10 carbon atoms, an alkenylene group having 1 to 10 carbon atoms, and an alkynylene group having 1 to 10 carbon atoms, and a divalent aromatic hydrocarbon group such as an arylene group), a divalent heterocyclic group, —O—, —S—, —NH—, —N(Q)-, —CO—, or a group formed by combination of these groups (for example, —O-divalent hydrocarbon group-, —(O-divalent hydrocarbon group)$_m$-O— (m represents an integer of 1 or more), and -divalent hydrocarbon group-O—CO—). Q represents a hydrogen atom or an alkyl group.

n represents 1 to 10. Among these, n is preferably 1 to 5, and more preferably 2 to 4.

P represents a hydrogen atom or a polymerizable group. The polymerizable group has the same definition as the polymerizable group that a liquid crystal compound which will be described later may have.

The infrared ray-absorbing coloring agent is more preferably a compound represented by Formula (3).

Formula (3)

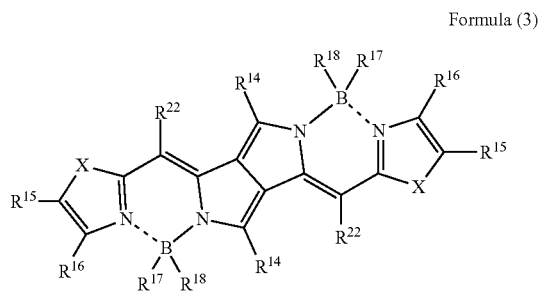

$R^{14}$ has the same definition as above.

$R^{22}$'s each independently represent a cyano group, an acyl group, an alkoxycarbonyl group, an alkylsulfinyl group, an arylsulfinyl group, or a nitrogen-containing heteroaryl group.

$R^{15}$ and $R^{16}$ each independently represent a hydrogen atom, an alkyl group, an alkoxy group, an aryl group, or a heteroaryl group, and $R^{15}$ and $R^{16}$ may be bonded to each other to form a ring. Examples of the ring formed include an alicycle having 5 to 10 carbon atoms, an aromatic hydrocarbon ring having 6 to 10 carbon atoms, and an aromatic heterocyclic ring having 3 to 10 carbon atoms. The ring formed by the bonding of $R^{15}$ and $R^{16}$ may further be substituted with a substituent. Examples of the substituent include the groups exemplified in the description of the substituent represented by each of $R^{11}$ and $R^{12}$.

$R^{17}$ and $R^{18}$ each independently represent an alkyl group, an alkoxy group, an aryl group, or a heteroaryl group. The group represented by each of $R^{17}$ and $R^{18}$ may further be substituted with a substituent. Examples of the substituent include the groups exemplified in the description of the substituent represented by each of $R^{11}$ and $R^{12}$.

X's each independently represent an oxygen atom, a sulfur atom, —NR—, —CRR'—, —CH=CH—, or —N=CH—, and R and R' each independently represent a hydrogen atom, an alkyl group, or an aryl group.

The visible light-absorbing dichroic coloring agent is not particularly limited, and examples thereof include an acridine coloring agent, an azine coloring agent, an azomethine coloring agent, an oxazine coloring agent, a cyanine coloring agent, a merocyanine coloring agent, a squarylium coloring agent, a naphthalene coloring agent, an azo coloring agent, an anthraquinone coloring agent, a benzotriazole coloring agent, a benzophenone coloring agent, a pyrazoline coloring agent, a diphenyl polyene coloring agent, a binaphthyl polyene coloring agent, a stilbene coloring agent, a benzothiazole coloring agent, a thienothiazole coloring agent, a benzimidazole coloring agent, a coumarin coloring agent, a nitrodiphenylamine coloring agent, a polymethine coloring agent, a naphthoquinone coloring agent, a perylene coloring agent, a quinophthalone coloring agent, a stilbene coloring agent, and an indigo coloring agent.

The dichroic ratio of the visible light-absorbing dichroic coloring agent is defined by a ratio of the absorbance of the visible light-absorbing dichroic coloring agent at a maximum absorption wavelength in the major axis direction to the absorbance of the visible light-absorbing dichroic coloring agent in the minor axis direction. The dichroic ratio can be determined by measuring the absorbance in the alignment direction of the visible light-absorbing dichroic coloring agent and the absorbance in the direction perpendicular to the alignment direction. The dichroic ratio of the visible light-absorbing dichroic coloring agent is preferably 2 to 50, and more preferably 5 to 30.

Furthermore, the visible light-absorbing dichroic coloring agent may have a polymerizable group. Examples of the polymerizable group include an acryloyl group, a methacrylic group, a vinyl group, a vinyloxy group, an epoxy group, and an oxetanyl group.

The maximum absorption wavelength of the visible light-absorbing dichroic coloring agent is preferably located in the range of 400 to 700 rin, and more preferably located in the range of 540 to 620 nm.

(Production Method)

A method for producing the phase difference film of an embodiment of the present invention is not particularly limited, and a known method can be used.

Among those, from the wavelength dispersion characteristics of the phase difference film are easily controlled, a method in which a composition for forming a phase difference film (hereinafter also simply referred to as a "composition"), including a liquid crystal compound having a polymerizable group (hereinafter also simply referred to as a "polymerizable liquid crystal compound") and the coloring agent (for example, an infrared ray-absorbing coloring agent or a visible light-absorbing coloring agent), is applied to form a coating film, the coating film is subjected to an alignment treatment to align the polymerizable liquid crystal compound, and the obtained coating film is subjected to a curing treatment (irradiation with ultraviolet rays (light irradiation treatment) or a heating treatment) to form a phase difference film is preferable.

Hereinafter, the procedure of the method will be described in detail.

First, the composition is applied onto a support to form a coating film and the coating film is subjected to an alignment treatment to align the polymerizable liquid crystal compound. The coloring agent is also aligned in a predetermined direction according to the alignment of the polymerizable liquid crystal compound.

The composition to be used includes a polymerizable liquid crystal compound. The polymerizable liquid crystal compound has the same definition as above.

In addition, the composition to be used includes a coloring agent such as an infrared my-absorbing coloring agent or a visible light-absorbing dichroic coloring agent.

The content of the polymerizable liquid crystal compound in the composition is not particularly limited, but is preferably 50% by mass or more, more preferably 70% by mass or more, and still more preferably 90% by mass or more, with respect to the total solid content in the composition. The upper limit is not particularly limited, but is 99% by mass or less in many cases.

In addition, the total solid content in the composition does not include a solvent.

The content of the coloring agent in the composition is not particularly limited, but in a case where the composition includes an infrared ray-absorbing coloring agent, the content of the infrared ray-absorbing coloring agent is preferably 1 to 20 parts by mass, and more preferably 3 to 15 parts by mass with respect to 100 parts by mass of the polymerizable liquid crystal compound.

In a case where the composition includes a visible light-absorbing dichroic coloring agent, the content of the visible light-absorbing dichroic coloring agent is preferably 0.01 to 0.50 parts by mass, more preferably 0.01 to 0.20 parts by mass, and still more preferably 0.05 to 0.15 parts by mass, with respect to 100 parts by mass of the polymerizable liquid crystal compound.

The composition may include a liquid crystal compound having no polymerizable group. Examples of the liquid crystal compound having no polymerizable group include a liquid crystal compound in which $L^1$ and $L^2$ in Formula (I) are both groups other than the polymerizable group.

In addition, the composition may include a polymerization initiator. The polymerization initiator to be used is selected according to the type of a polymerization reaction, and examples thereof include a thermal polymerization initiator and a photopolymerization initiator. Examples of the photopolymerization initiator include an α-carbonyl compound, an acyloin ether, an α-hydrocarbon substituted aromatic acyloin compound, a polynuclear quinone compound, and a combination of a triarylimidazole dimer and a p-aminophenyl ketone.

The content of the polymerization initiator in the composition is preferably 0.01% to 20% by mass, and more preferably 0.5% to 5% by mass, with respect to the total solid content of the composition.

In addition, the composition may include a polymerizable monomer other than the polymerizable liquid crystal compound.

Examples of the polymerizable monomer include a radically polymerizable or cationically polymerizable compound. Among those, a polyfunctional radically polymerizable monomer is preferable. In addition, as the polymerizable monomer, a monomer which is copolymerizable with the liquid crystal compound having a polymerizable group is preferable. Examples of the polymerizable monomer include those described in paragraphs [0018] to [0020] of JP2002-296423A.

The content of the polymerizable monomer in the composition is preferably 1% to 50% by mass, and more preferably 2% to 30% by mass, with respect to the total mass of the polymerizable liquid crystal compound.

In addition, the composition may include a surfactant.

Examples of the surfactant include compounds known in the related art, but a fluorine-based compound is particularly preferable. Examples of the compound include the compounds described in paragraphs [0028] to [0056] of JP2001-330725A and the compounds described in paragraphs [0069] to [0126] of JP2003-295212.

In addition, the composition may include a solvent. As the solvent, an organic solvent is preferable. Examples of the organic solvent include an amide (for example, N,N-dimethylformamide), a sulfoxide (for example, dimethyl sulfoxide), a heterocyclic compound (for example, pyridine), a hydrocarbon (for example, benzene and hexane), an alkyl halide (for example, chloroform and dichloromethane), an ester (for example, methyl acetate, ethyl acetate, and butyl acetate), a ketone (for example, acetone and methyl ethyl ketone), and an ether (for example, tetrahydrofuran and 1,2-dimethoxyethane). In addition, two or more kinds of the organic solvents may be used in combination.

Moreover, various alignment control agents such as a vertical alignment agent and a horizontal alignment agent may be included in the composition. Such an alignment control agent is a compound which is capable of controlling the horizontal or vertical alignment of a liquid crystal compound at an interface.

In addition, in addition to the components, an adhesion improver, a plasticizer, and a polymer may be included in the composition.

The support to be used is a member having a function as a base material for applying a composition thereon. The support may be a temporary support which is peeled after applying the composition and performing curing.

As the support (temporary support), a glass substrate may be used, in addition to a plastic film. Examples of a material constituting the plastic film include a polyester resin such as polyethylene terephthalate (PET), a polycarbonate resin, a (meth)acryl resin, an epoxy resin, a polyurethane resin, a polyamide resin, a polyolefin resin, a cellulose derivative, a silicone resin, and polyvinyl alcohol (PVA).

The thickness of the support only needs to be about 5 m to 1,000 mm, preferably 10 to 250 mm, and more preferably 15 to 90 mm.

Moreover, an alignment film may be arranged on the support, as desired.

The alignment film generally has a polymer as a main component. Polymers for an alignment film are described in many documents and a large number of commercially available products thereof can be obtained. The polymer to be used is preferably polyvinyl alcohol, polyimide, or a derivative thereof.

In addition, it is preferable that the alignment film is subjected to a known rubbing treatment.

The thickness of the alignment film is preferably 0.01 to 10 μm and more preferably 0.01 to 1 μm.

Examples of a method for applying the composition include a curtain coating method, a dip coating method, a spin coating method, a printing coating method, a spray coating method, a slot coating method, a roll coating method, a slide coating method, a blade coating method, a gravure coating method, and a wire bar method. A single layer coating is preferable in a case of performing coating by any of these methods.

The coating film formed on the support is subjected to an alignment treatment to align the polymerizable liquid crystal compound in the coating film.

The alignment treatment can be performed by drying the coating film at room temperature or heating the coating film. In a case of a thermotropic liquid crystal compound, a liquid crystal phase formed with the alignment treatment can generally be transferred by a change in a temperature or pressure. In a case of a lyotropic liquid crystal compound, the liquid crystal phase can also be transferred according to a compositional ratio such as the amount of a solvent.

Furthermore, the condition in a case of heating the coating film is not particularly limited, but the heating temperature is preferably 50° C. to 150° C., and the heating time is preferably 10 seconds to 5 minutes.

Next, the coating film in which the polymerizable liquid crystal compound has been aligned is subjected to a curing treatment.

A method for the curing treatment to be carried out on the coating film in which the polymerizable liquid crystal compound has been aligned is not particularly limited, and examples thereof include a light irradiation treatment and a heating treatment. Among those, from the viewpoint of manufacturing suitability, the light irradiation treatment is preferable, and an ultraviolet ray-irradiation treatment is more preferable.

An irradiation condition for the light irradiation treatment is not particularly limited, but an irradiation dose of 50 to 1,000 mJ/cm$^2$ is preferable.

The phase difference film can be applied to various applications, and particularly preferably to an antireflection application. More specifically, it can be suitably applied to antireflection applications of display devices such as an organic EL display device.

<Circularly Polarizing Plate>

The circularly polarizing plate of an embodiment of the present invention includes a polarizer and the above-mentioned phase difference film.

Hereinafter, each member included in the circularly polarizing plate will be described in detail.

First, the form of the phase difference film included in the circularly polarizing plate is as described above.

(Polarizer)

The polarizer is a member (linear polarizer) having a function of converting light into specific linearly polarized light, and examples thereof include an absorption type polarizer.

Examples of the absorption type polarizer include an iodine-based polarizer, a dye-based polarizer using a dichroic dye, and a polyene-based polarizer. As the iodine-based polarizer and the dye-based polarizer, there are a coating type polarizer and a stretched type polarizer, and a both thereof can be applied. Among those, a polarizer manufactured by adsorbing iodine or a dichroic dye on polyvinyl alcohol, followed by stretching, is preferable.

In addition, examples of a method of obtaining a polarizer by carrying out stretching and dyeing in a state of a laminated film in which a polyvinyl alcohol layer is formed on a base material include the methods described in JP5048120B, JP5143918B, JP5048120B, JP4691205B, JP4751481B, and JP4751486B, and known technologies relating to these polarizers can also be preferably used.

Among those, the polarizer is preferably a polarizer including a polyvinyl alcohol-based resin (a polymer including —$CH_2$—CHOH— as a repeating unit, in particular, at least one selected from the group consisting of a polyvinyl alcohol and an ethylene-vinyl alcohol copolymer is preferable) from the viewpoint of handleability.

The thickness of the polarizer is not particularly limited, but from the viewpoint that the polarizer is excellent in handleability and optical characteristics, the thickness is preferably 35 μm or less, more preferably 3 to 25 μm, and still more preferably 4 to 15 μm. With the thickness, it is also possible to correspond to a reduction in the thickness of an image display device.

An angle θ formed between the absorption axis of the polarizer and the in-plane slow axis of the phase difference film is preferably 45° 10° from the viewpoint that the effect of the present invention is more excellent. That is, the angle θ is preferably 35° to 55°. Among those, from the viewpoint that the effect of the present invention is more excellent, the angle θ formed between the absorption axis of the polarizer and the in-plane slow axis of the phase difference film is more preferably 40° to 50°, and still more preferably 42° to 48°.

Furthermore, the angle is intended to mean an angle formed between the absorption axis of the polarizer and the in-plane slow axis of the phase difference film in a case of being visually recognized from the normal direction of a surface of the polarizer.

(Other Layers)

The circularly polarizing plate may include a polarizer and a layer other than the phase difference film as long as the effect of the present invention is not impaired.

For example, the circularly polarizing plate may include an alignment film having a function of defining the alignment direction of the liquid crystal compound. The arrangement position of the alignment film is not particularly limited, and examples thereof include a position between the polarizer and the phase difference film.

The material constituting the alignment film and the thickness of the alignment film are as described above.

In addition, the circularly polarizing plate may include an adhesive layer or pressure sensitive layer for adhering the respective layers.

A polarizer protective film may further be arranged on a surface of the polarizer.

The configuration of the polarizer protective film is not particularly limited, and may be, for example, a transparent support or a hard coat layer, or a laminate of the transparent support and the hard coat layer.

As the hard coat layer, a known layer can be used, and for example, a layer obtained by polymerizing and curing the above-mentioned polyfunctional monomers may be used.

Moreover, examples of the transparent support include known transparent supports. In addition, examples of a material forming the transparent support include a cellulose-based polymer typified by triacetyl cellulose (hereinafter referred to as cellulose acylate), a thermoplastic norbornene-based resin (ZEONEX or ZEONOR manufactured by Nippon Zeon Co., Ltd., ARTON manufactured by JSR Corporation, and the like), a (meth)acrylic resin, and a polyester-based resin.

The thickness of the polarizer protective film is not particularly limited, but is preferably 40 μm or less, and more preferably 25 μm or less from the viewpoint that the thickness of the circularly polarizing plate can be reduced.

Furthermore, the circularly polarizing plate may include a support. As the support, a so-called transparent support is preferable.

Moreover, examples of the transparent support include known transparent supports. In addition, examples of a material forming the transparent support include a cellulose-based polymer typified by triacetyl cellulose (hereinafter referred to as cellulose acylate), a thermoplastic norbornene-based resin (ZEONEX or ZEONOR manufactured by Nippon Zeon Co., Ltd., ARTON manufactured by JSR Corporation, and the like), a (meth)acrylic resin, and a polyester-based resin.

The circularly polarizing plate may have a film having a phase difference, which is other than the above-mentioned phase difference film. For example, it may have a so-called positive C-plate.

A method for producing the circularly polarizing plate is not particularly limited, and examples thereof include a method of bonding each of the prepared polarizers and a phase difference film via an adhesive or a pressure sensitive adhesive.

The circularly polarizing plate can be applied to various applications, and can be particularly suitably applied to an antireflection application. More specifically, it can be suitably applied to antireflection applications of display devices such as an organic EL display device.

<Organic EL Display Device>

The organic EL display device of an embodiment of the present invention preferably has a polarizer, a phase difference film, and an organic EL display panel in this order. In addition, the polarizer in the circularly polarizing plate is usually arranged on a visual recognition side.

The forms of the polarizer and the phase difference film are as described above.

The organic EL display panel is a display panel constituted with an organic EL element in which an organic light emitting layer (organic electroluminescent layer) is sandwiched between electrodes (between a cathode and an anode).

The configuration of the organic EL display panel is not particularly limited but a known configuration is adopted.

EXAMPLES

Hereinafter, the features of the present invention will be described in more details with reference to Examples and Comparative Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to specific examples shown below.

<Comparative Example 1>

A composition for forming a polyimide alignment film, SE-130 (manufactured by Nissan Chemical Industries, Ltd.), was applied onto a washed glass substrate by a spin coating method. After the coating film was dried and then calcined at 250° C. for 1 hour, the coating film was subjected to a rubbing treatment to form an alignment film.

The following composition A-1 was applied onto the alignment film by a spin coating method. After the coating film formed on the alignment film was heated to 240° C. on a hot plate and then cooled to 200° C., the coating film was irradiated with ultraviolet rays at 500 mJ/cm$^2$ at a wavelength of 365 nm under a nitrogen atmosphere using a high-pressure mercury lamp to fix the alignment of the liquid crystal compound, thereby manufacturing a phase difference film A-1. The thickness of the phase difference film A-1 is shown in Table 1.

| Composition A-1 | |
|---|---|
| Liquid crystal compound L-1 | 42.00 parts by mass |
| Liquid crystal compound L-2 | 42.00 parts by mass |
| Liquid crystal compound L-3 | 16.00 parts by mass |
| Polymerization initiator PI-1 | 0.50 parts by mass |
| Leveling agent T-1 | 0.20 parts by mass |
| Chloroform | 560.00 parts by mass |

Liquid Crystal Compound L-1

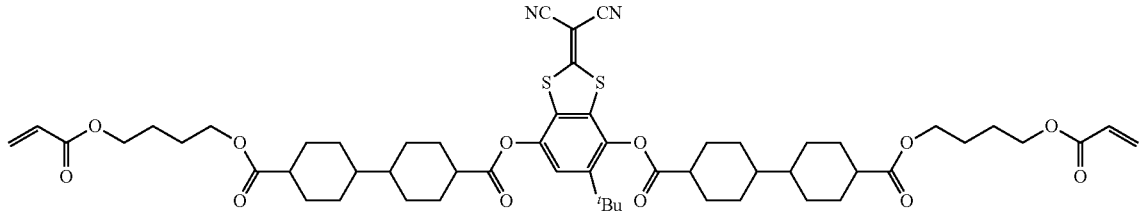 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Liquid Crystal Compound L-2

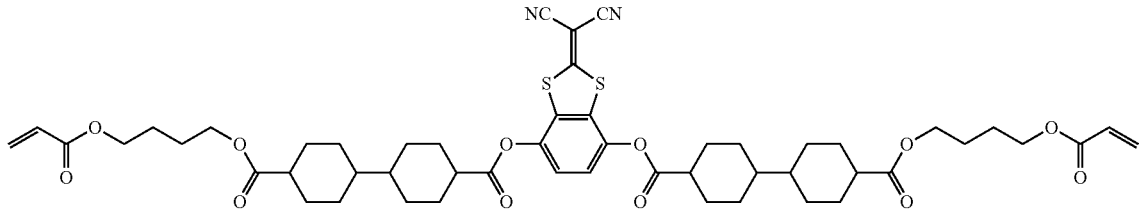 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Liquid Crystal Compound L-3

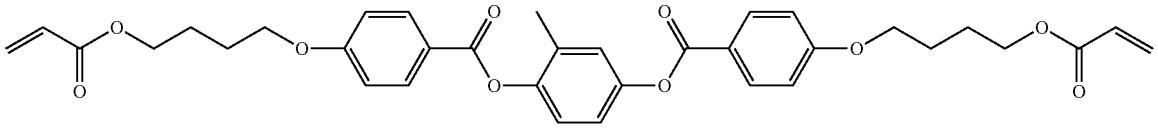

Polymerization Initiator PI-1

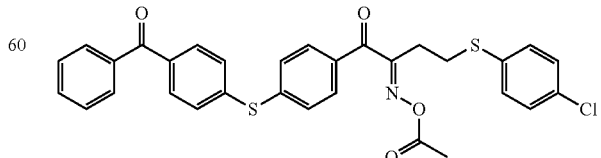

Leveling Agent T-1

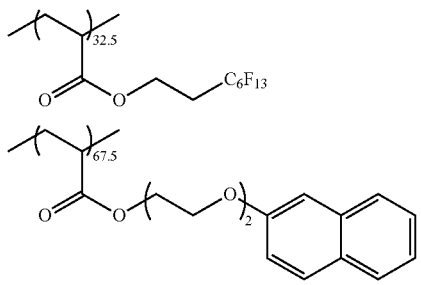

Example 1

A phase difference film A-4 was manufactured by the same method as in Comparative Example 1, except that 14.00 parts by mass of the following dichroic coloring agent D-1 (maximum absorption wavelength: 706 nm/785 nm) was added to the composition A-1 and the thickness was adjusted.

Dichroic coloring agent D-1

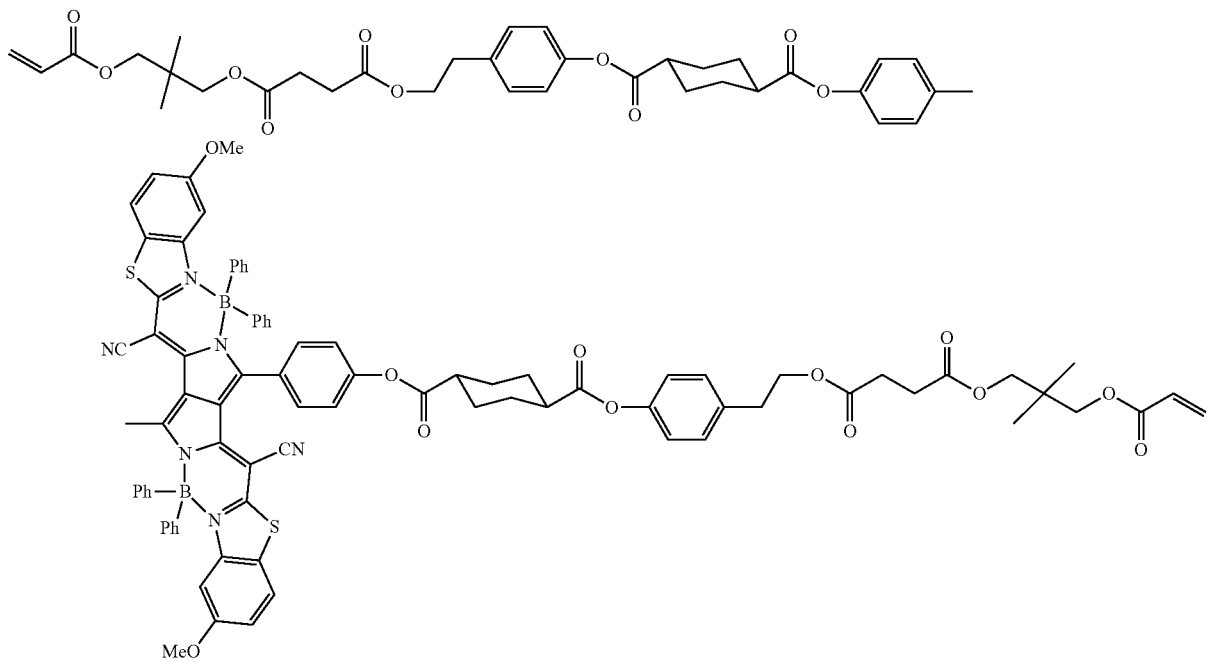

Comparative Example 2

A phase difference film A-2 was manufactured by the same method as in Comparative Example 1, except that the thickness was adjusted.

Comparative Example 3

A phase difference film A-3 was manufactured by the same method as in Comparative Example 1, except that the composition A-1 was changed to the following composition A-2 and the thickness was adjusted.

| Composition A-3 | |
|---|---|
| Liquid crystal compound L-1 | 50.00 parts by mass |
| Liquid crystal compound L-2 | 50.00 parts by mass |
| Polymerization initiator PI-1 | 0.50 parts by mass |
| Leveling agent T-1 | 0.20 parts by mass |
| Chloroform | 560.00 parts by mass |

Example 2

A phase difference film A-5 was manufactured by the same method as in Example 1, except that 10.00 parts by mass of the dichroic coloring agent D-1 was added to the composition A-1 and the thickness was adjusted.

Example 3

A phase difference film A-6 was manufactured by the same method as in Example 2. except that the thickness was adjusted.

Example 4

A phase difference film A-7 was manufactured by the same method as in Example 1, except that 5.00 parts by mass of the dichroic coloring agent D-1 was added to the composition A-1 and the thickness was adjusted.

Example 5

A phase difference film A-8 was manufactured by the same method as in Comparative Example 1, except that 0.20 parts by mass of a dichroic coloring agent G-241 (maximum absorption wavelength: 555 nm, manufactured by Nagase & Co., Ltd.) was added to the composition A-1 and the thickness was adjusted.

Comparative Example 4

A phase difference film A-9 was manufactured by the same method as in Comparative Example 1, except that 0.70 parts by mass of a dichroic coloring agent G-241 (manufactured by Nagase & Co., Ltd.) was added to the composition A-1 and the thickness was adjusted.

Comparative Example 5

A phase difference film A-10 was manufactured by the same method as in Comparative Example 1, except that 0.20 parts by mass of a dichroic coloring agent M-137 (maximum absorption wavelength: 582 nm/621 nm, manufactured by Mitsui Fine Chemicals, Inc.) was added to the composition A-1 and the thickness was adjusted.

Comparative Example 6

A phase difference film A-11 was manufactured by the same method as in Comparative Example 1, except that 1.00 part by mass of a dichroic coloring agent M-137 (manufactured by Mitsui Fine Chemicals, Inc.) was added to the composition A-1 and the thickness was adjusted.

<Formation of Circularly Polarizing Plate>

A surface of a TD80UL (manufactured by FUJIFILM Corporation) which is a support was subjected to an alkali saponification treatment. Specifically, the support was immersed in a 1.5 N aqueous sodium hydroxide solution at 55° C. for 2 minutes, and the extracted support was washed in a water-washing bathtub at room temperature and neutralized with 0.1 N sulfuric acid at 30° C. Thereafter, the obtained support was washed in a water-washing bathtub at room temperature and further dried with a hot air at 100° C.

Subsequently, a roll-shaped polyvinyl alcohol film having a thickness of 80 μm was continuously stretched five times in an iodine aqueous solution, and the stretched film was dried to obtain a polarizer having a thickness of 20 μm.

The obtained polarizer and a support (TD80UL) which had been subjected to an alkali saponification treatment were bonded to each other to obtain a polarizing plate having a polarizer exposed on one side.

Next, the polarizer in the polarizing plate and the coated surface of the phase difference film were bonded to each other via a pressure sensitive adhesive so that an angle formed between the absorption axis of the polarizer and the slow axis of each of the phase difference films A-1 to A-11 manufactured in Examples 1 to 5 and Comparative Examples 1 to 6 was 45°, then the glass substrate was peeled off, and only the phase difference film was transferred onto the polarizer to manufacture each of circularly polarizing plates P-1 to P-11.

Various evaluation results of the phase difference films and the circularly polarizing plates manufactured in Examples 1 to 5 and Comparative Examples 1 to 6 are summarized in Table 1.

<Measurement of Optical Characteristics>

The in-plane retardation was measured in a wavelength range of 400 to 700 nm using AxoScan OPMF-1 (manufactured by Opto Science, Inc.).

Based on the obtained data, it was determined whether or not Requirements 2 to 9 were satisfied.

<Measurement of Film Thickness>

The thickness of the phase difference film was measured using a reflection spectral film thickness meter FE3000 (manufactured by Otsuka Electronics Co., Ltd.).

<Measurement of Film Tint>

Δxy was calculated according to the above-mentioned method.

(Mounting in Organic EL Display Device)

GALAXY S IV manufactured by Samsung Electronics Co., Ltd., equipped with an organic EL display panel, was disintegrated, the circularly polarizing plate was peeled, and each of the circularly polarizing plates P-1 to P-11 was bonded onto the organic EL display panel to manufacture an organic EL display device.

<Evaluation of White Display Tint>

The organic EL display device was turned on and visual evaluation was performed in a state where white display is shown in the entire area.

A: Tinting is not felt.
B: There is tinting, which is, however, acceptable.
C: Tinting is unacceptable.

<Evaluation of Antireflection Performance>

(Reflectivity)

For the organic EL display device obtained above (in a power-off state), the measurement was performed in a specular component excluded (SCE) mode using a colorimeter (CM-2022, manufactured by Konica Minolta, Inc.), and the obtained Y value was evaluated according to the following standard using Comparative Example 1 as a reference.

A: A case where a proportion of the Y value to the Y value in Comparative Example 1 is 20% or less.
B: A case where a proportion of the Y value to the Y value in Comparative Example 1 is more than 20% and 40% or less.
C: A case where a proportion of the Y value to the Y value in Comparative Example 1 is more than 40%.

(Reflection Tint)

The organic EL display device obtained above (in a power-off state) was measured in a specular component-excluded (SCE) mode using a colorimeter (CM-2022, manufactured by Konica Minolta, Inc.), defined by the following formulae with a use of a* and b* of the obtained reflected light, and evaluated according to the following standard, based on the results of Comparative Example 1.

$$|ab| = a^2 + b^2$$

A: A case where a proportion of the |ab| to the |ab| value in Comparative Example 1 is less than 70%.
B: A case where a proportion of the |ab| to the |ab| value in Comparative Example 1 is 70% or more and less than 100%.
C: A case where a proportion of the |ab| to the |ab| value in Comparative Example 1 is 100% or more and less than 150%.
D: A case where a proportion of the |ab| to the |ab| value in Comparative Example 1 is 150% or more.

In Table 1, "Re(550)" shows an in-plane retardation of the phase difference film at a wavelength of 550 nm.

"Addition amount" in the "Coloring agent" column shows an amount of the coloring agent used with respect to 100 parts by mass of the liquid crystal compound.

A value of Δxy is shown in the "Requirement 1 (Δxy)" column.

In the "Requirements 2 and 3" column, a case where the above-mentioned Requirements 2 and 3 are satisfied is indicated as "A", and a case where at least one of Requirement 2 or 3 is not satisfied is indicated as "B".

In the "Requirements 4 and 5" column, a case where the above-mentioned Requirements 4 and 5 are satisfied is indicated as "A", and a case where at least one of Requirement 4 or 5 is not satisfied is indicated as "B".

In the "Requirement 6" column, a case where the above-mentioned Requirement 6 is satisfied is indicated as "A", and a case where Requirement 6 is not satisfied is indicated as "B".

In the "Requirement 7" column, a case where the above-mentioned Requirement 7 is satisfied is indicated as "A", and a case where Requirement 7 is not satisfied is indicated as "B".

In the "Requirement 8" column, a case where the above-mentioned Requirement 8 is satisfied is indicated as "A", and a case where Requirement 8 is not satisfied is indicated as "B".

In the "Requirement 9" column, a case where the above-mentioned Requirement 9 is satisfied is indicated as "A", and a case where Requirement 9 is not satisfied is indicated as "B".

In the "Requirement 10" column, a case where the above-mentioned Requirement 10 is satisfied is indicated as "A", and a case where Requirement 10 is not satisfied is indicated as "B".

In the "Requirement 11" column, a case where Requirement 11 is satisfied is indicated as "A", and a case where Requirement 11 is not satisfied is indicated as "B".

TABLE 1

| | Polarizing plate | Phase difference film | | | | | Coloring agent | | Requirement 1 (Δxy) | Requirements 2 and 3 |
| --- | --- | --- | --- | --- | --- | --- | --- | --- | --- | --- |
| | | Type | Thickness (μm) | Re (550) | Re(450)/Re(550) | Re(650)/Re(550) | Type | Addition amount (parts by mass) | | |
| Comparative Example 1 | P-1 | A-1 | 2.8 | 144 | 0.82 | 1.04 | None | — | 0.003 | B |
| Comparative Example 2 | P-2 | A-2 | 2.7 | 138 | 0.82 | 1.04 | None | — | 0.003 | B |
| Comparative Example 3 | P-3 | A-3 | 3.7 | 141 | 0.69 | 1.09 | None | — | 0.003 | B |
| Example 1 | P-4 | A-4 | 2.0 | 138 | 0.82 | 1.18 | D-1 | 14.0 | 0.007 | A |
| Example 2 | P-5 | A-5 | 2.1 | 138 | 0.82 | 1.14 | D-1 | 10.0 | 0.006 | A |
| Example 3 | P-6 | A-6 | 2.2 | 144 | 0.82 | 1.14 | D-1 | 10.0 | 0.006 | A |
| Example 4 | P-7 | A-7 | 2.5 | 139 | 0.82 | 1.09 | D-1 | 5.0 | 0.005 | A |
| Example 5 | P-8 | A-8 | 2.8 | 142 | 0.80 | 1.09 | G-241 | 0.2 | 0.007 | A |
| Comparative Example 4 | P-9 | A-9 | 2.8 | 141 | 0.82 | 1.07 | G-241 | 0.7 | 0.039 | A |
| Comparative Example 5 | P-10 | A-10 | 2.7 | 139 | 0.85 | 1.23 | M-137 | 0.2 | 0.003 | B |
| Comparative Example 6 | P-11 | A-11 | 2.7 | 138 | 0.78 | 1.18 | M-137 | 1.0 | 0.033 | B |

| | Requirements 4 and 5 | Requirement 6 | Requirement 7 | Requirement 8 | Requirement 9 | Requirement 10 | Requirement 11 | Evaluation | | |
| --- | --- | --- | --- | --- | --- | --- | --- | --- | --- | --- |
| | | | | | | | | White display | Reflectivity | Reflection tint |
| Comparative Example 1 | B | B | B | A | B | B | B | A | — | — |
| Comparative Example 2 | B | B | B | A | B | B | B | A | C | D |
| Comparative Example 3 | B | B | B | B | B | B | B | A | B | D |
| Example 1 | A | A | A | A | A | A | A | A | A | A |
| Example 2 | A | A | A | A | A | A | A | A | A | A |
| Example 3 | A | A | A | A | A | A | A | A | B | A |
| Example 4 | B | A | A | A | B | A | A | A | B | B |
| Example 5 | B | A | B | A | B | A | A | A | B | C |
| Comparative Example 4 | B | B | B | B | B | A | B | C | B | D |
| Comparative Example 5 | B | B | B | A | B | B | B | A | C | C |
| Comparative Example 6 | B | B | B | B | B | B | B | C | B | C |

As shown in Table 1, it was possible to obtain a desired effect by using the phase difference film of the embodiment of the present invention.

Among those, as can be seen from the comparison of Examples 1 to 5, it was confirmed that a more excellent effect can be obtained in a case where Requirements 4, 5, 7, and 9 are satisfied.

Furthermore, with regard to Examples 1 to 5, it was also confirmed that Requirements 12 and 13 were satisfied. With regard to Examples 1 to 3, it was also confirmed that Requirements 14 and 15 were satisfied. In addition, with regard to Examples 1 to 5, it was confirmed that the in-plane retardation Re(λ1) of the first phase difference film at a wavelength of λ1 in a wavelength range of 450 to 500 nm satisfies Requirement 2, and the in-plane retardation Re(λ2) of the first phase difference film at a wavelength of λ2 in a wavelength range of 600 to 650 nm satisfies Requirement 3.

What is claimed is:

1. A phase difference film formed of at least a liquid crystal compound,
wherein an in-plane retardation at a wavelength of 550 nm is 100 to 200 nm,
on a CIE xy chromaticity diagram, Δxy which is a difference between a chromaticity of transmitted light obtained by making light of a standard light source D65 incident on the phase difference film and a chromaticity of the standard light source D65 satisfies Requirement 1, and
in a graph where wavelengths of measurement light incident on the phase difference film are plotted on a horizontal axis and in-plane retardations of the phase difference film at every 25 nm wavelength of measurement light in a wavelength range of 450 to 600 nm are plotted on a vertical axis, all of slopes S of straight lines connecting two adjacent plot points satisfy Requirement 6,
Requirement 1: Δxy<0.010,
provided that Δxy is calculated by the following formula, Formula: $\Delta xy = ((x-x0)^2 + (y-y0)^2)^{1/2}$, in the formula, x and y represent a chromaticity coordinate of transmitted light of the phase difference film on the CIE xy chromaticity diagram, and x0 and y0 represent a chromaticity coordinate of a standard light source D65 on the CIE xy chromaticity diagram,
Requirement 6: 0.10<Slope S≤1.0.

2. The phase difference film according to claim 1,
wherein in a graph where wavelengths of measurement light incident on the phase difference film are plotted on a horizontal axis and in-plane retardations of the phase difference film at every 25 nm wavelength of measurement light in a wavelength range of 450 to 650 nm are plotted on a vertical axis, all of slopes S of straight lines connecting two adjacent plot points satisfy Requirement 7,
Requirement 7: 0.10<Slope S≤1.0.

3. The phase difference film according to claim 1,
wherein in the graph, a slope S(550) of a straight line obtained by connecting the plot point at a wavelength of 550 nm of the measurement light and the plot point at a wavelength of 575 nm of the measurement light satisfies Requirement 8,
Requirement 8: 0.10<Slope S(550)<0.20.

4. The phase difference film according to claim 1,
wherein in the graph, a slope S(625) of a straight line obtained by connecting a plot point at a wavelength of 625 nm and a plot point at a wavelength of 650 nm satisfies Requirement 9,
Requirement 9: 0<|Slope S(625)−0.25|<0.15.

5. A phase difference film formed of at least a liquid crystal compound,
wherein an in-plane retardation at a wavelength of 550 nm is 100 to 200 nm,
on a CIE xy chromaticity diagram, Δxy which is a difference between a chromaticity of transmitted light obtained by making light of a standard light source D65 incident on the phase difference film and a chromaticity of the standard light source D65 satisfies Requirement 1, and
in a graph where wavelengths of measurement light incident on the phase difference film are plotted on a horizontal axis and in-plane retardations of the phase difference film at the respective wavelengths of measurement light standardized by setting an in-plane retardation of the phase difference film at a measurement wavelength of 550 nm to 1.0 are plotted on a vertical axis, an in-plane retardation Re(λd) of the phase difference film at a wavelength of λ1 in a wavelength range of 450 to 550 nm satisfies Requirement 10 and an in-plane retardation Re(λ2) of the phase difference film at a wavelength of λ2 in a wavelength range of 550 to 650 nm satisfies Requirement 11,
Requirement 1: Δxy<0.010,
provided that Δxy is calculated by the following formula,
Formula: $\Delta xy = ((x-x0)^2 + (y-y0)^2)^{1/2}$,
in the formula, x and y represent a chromaticity coordinate of transmitted light of the phase difference film on the CIE xy chromaticity diagram, and x0 and y0 represent a chromaticity coordinate of the standard light source D65 on the CIE xy chromaticity diagram,
Requirement 10: 0.0027×λ1−0.5≤Re(λ1)/Re(550)≤0.0014×λ1+0.25,
Requirement 11: 0.0009×λ2+0.5≤Re(λ2)/Re(550)≤0.0023×λ2−0.25.

6. The phase difference film according to claim 1,
wherein the liquid crystal compound exhibits reciprocal wavelength dispersibility.

7. A circularly polarizing plate comprising:
a polarizer; and
the phase difference film according to claim 1.

8. An organic electroluminescent display device comprising:
an organic electroluminescent display panel; and
the circularly polarizing plate according to claim 7 arranged on the organic electroluminescent display panel.

9. The phase difference film according to claim 2,
wherein in the graph, a slope S(550) of a straight line obtained by connecting the plot point at a wavelength of 550 nm of the measurement light and the plot point at a wavelength of 575 nm of the measurement light satisfies Requirement 8,
Requirement 8: 0.10<Slope S(550)<0.20.

10. The phase difference film according to claim 2,
wherein in the graph, a slope S(625) of a straight line obtained by connecting a plot point at a wavelength of 625 nm and a plot point at a wavelength of 650 nm satisfies Requirement 9,
Requirement 9: 0<|Slope S(625)−0.25|<0.15.

11. The phase difference film according to claim 2,
wherein the liquid crystal compound exhibits reciprocal wavelength dispersibility.

12. A circularly polarizing plate comprising:
a polarizer; and
the phase difference film according to claim 2.

13. An organic electroluminescent display device comprising:
an organic electroluminescent display panel; and
the circularly polarizing plate according to claim 12 arranged on the organic electroluminescent display panel.

14. The phase difference film according to claim 3, wherein in the graph, a slope S(625) of a straight line obtained by connecting a plot point at a wavelength of 625 nm and a plot point at a wavelength of 650 nm satisfies Requirement 9,
Requirement 9: 0<|Slope S(625)−0.25|<0.15.

15. The phase difference film according to claim 3, wherein the liquid crystal compound exhibits reciprocal wavelength dispersibility.

16. A circularly polarizing plate comprising:
a polarizer, and
the phase difference film according to claim 3.

17. An organic electroluminescent display device comprising:
an organic electroluminescent display panel; and
the circularly polarizing plate according to claim 16 arranged on the organic electroluminescent display panel.

18. The phase difference film according to claim 5, wherein the liquid crystal compound exhibits reciprocal wavelength dispersibility.

19. A circularly polarizing plate comprising:
a polarizer, and
the phase difference film according to claim 5.

20. An organic electroluminescent display device comprising:
an organic electroluminescent display panel; and
the circularly polarizing plate according to claim 19 arranged on the organic electroluminescent display panel.

* * * * *